US009236390B2

(12) United States Patent  
Masuoka et al.

(10) Patent No.: US 9,236,390 B2  
(45) Date of Patent: Jan. 12, 2016

(54) SEMICONDUCTOR DEVICE AND METHOD FOR PRODUCING THE SAME

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: Unisantis Electronics Singapore Ptd. Ltd., Singapore (SG)

( * ) Notice: Subject to any disclaimer, the term of this patent is extended or adjusted under 35 U.S.C. 154(b) by 0 days.

(21) Appl. No.: 14/689,670

(22) Filed: Apr. 17, 2015

(65) Prior Publication Data

US 2015/0221662 A1     Aug. 6, 2015

Related U.S. Application Data

(63) Continuation of application No. 14/018,614, filed on Sep. 5, 2013, now Pat. No. 9,041,092.

(60) Provisional application No. 61/698,054, filed on Sep. 7, 2012.

(51) Int. Cl.
　　*H01L 27/115*　　(2006.01)
　　*H01L 29/788*　　(2006.01)
　　*H01L 29/66*　　(2006.01)
　　*H01L 29/78*　　(2006.01)

(52) U.S. Cl.
　　CPC .... *H01L 27/11521* (2013.01); *H01L 29/66484* (2013.01); *H01L 29/66825* (2013.01); *H01L 29/785* (2013.01); *H01L 29/788* (2013.01); *H01L 29/7889* (2013.01)

(58) Field of Classification Search
　　None
　　See application file for complete search history.

(56) References Cited

U.S. PATENT DOCUMENTS

| 6,630,708 B1 | 10/2003 | Uchiyama |
| 7,385,243 B2 | 6/2008 | Graham et al. |

(Continued)

FOREIGN PATENT DOCUMENTS

| JP | H08148587 A | 6/1996 |
| JP | 2005526382 A | 9/2005 |
| JP | 2011258812 A | 12/2011 |

(Continued)

OTHER PUBLICATIONS

Ohba, T., et al., "A novel tri-control gate surrounding gate transistor (TCG-SGT) nonvolatile memory cell for flash memory", Solid-State Electronics, Jun. 2006, pp. 924-928, vol. 50, No. 6.

(Continued)

*Primary Examiner* — Yasser A Abdelaziez
(74) *Attorney, Agent, or Firm* — Laurence Greenberg; Werner Stemer; Ralph Locher

(57) ABSTRACT

A semiconductor device includes a pillar-shaped silicon layer including a first diffusion layer, a channel region, and a second diffusion layer formed in that order from the silicon substrate side, floating gates respectively disposed in two symmetrical directions so as to sandwich the pillar-shaped silicon layer, and a control gate line disposed in two symmetrical directions other than the two directions so as to sandwich the pillar-shaped silicon layer. A tunnel insulating film is formed between the pillar-shaped silicon layer and each of the floating gates. The control gate line is disposed so as to surround the floating gates and the pillar-shaped silicon layer with an inter-polysilicon insulating film interposed therebetween.

5 Claims, 27 Drawing Sheets

(56) References Cited

U.S. PATENT DOCUMENTS

| | | |
|---|---|---|
| 8,349,688 B2 | 1/2013 | Masuoka et al. |
| 8,471,327 B2 | 6/2013 | Masuoka et al. |
| 8,940,603 B2 * | 1/2015 | Tempel ............ H01L 21/28273 438/257 |
| 2007/0045709 A1 | 3/2007 | Yang |
| 2008/0315917 A1 | 12/2008 | Forbes et al. |
| 2009/0129171 A1 | 5/2009 | Masuoka et al. |
| 2011/0303966 A1 | 12/2011 | Masuoka et al. |

FOREIGN PATENT DOCUMENTS

| | | |
|---|---|---|
| JP | 2012028678 A | 2/2012 |
| JP | 2012033631 A | 2/2012 |
| WO | 2006132158 A1 | 12/2006 |

OTHER PUBLICATIONS

Wu, C.C., et al., "High performance 22/20 nm FinFET CMOS devices with advanced high-K/metal gate scheme", IEDM2010, CC. Wu, et. al, 27.1.1-27.1.4.

* cited by examiner

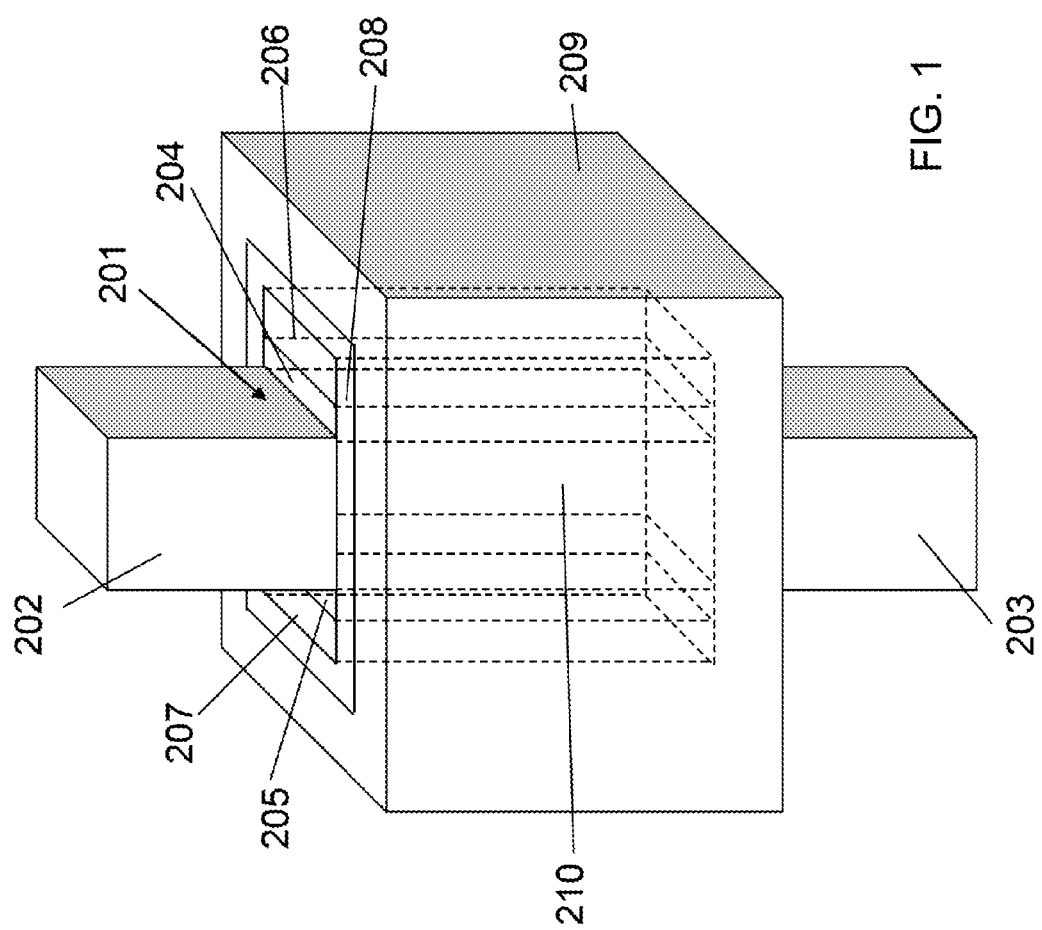

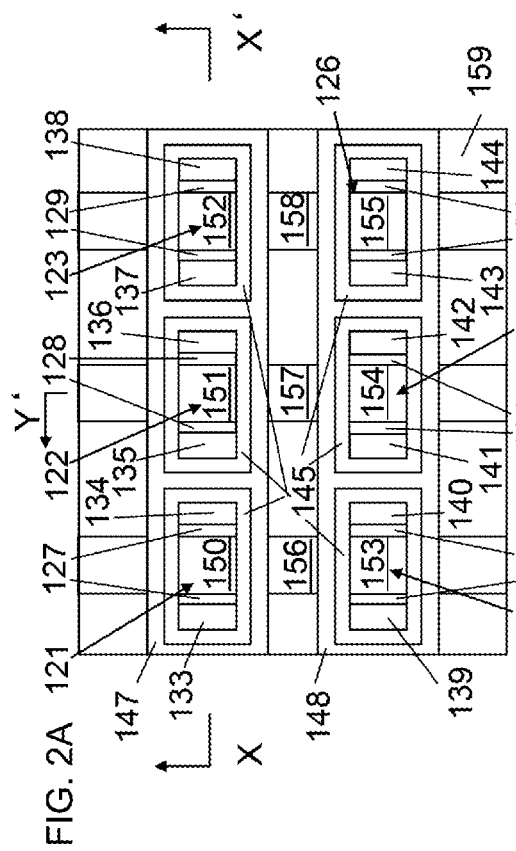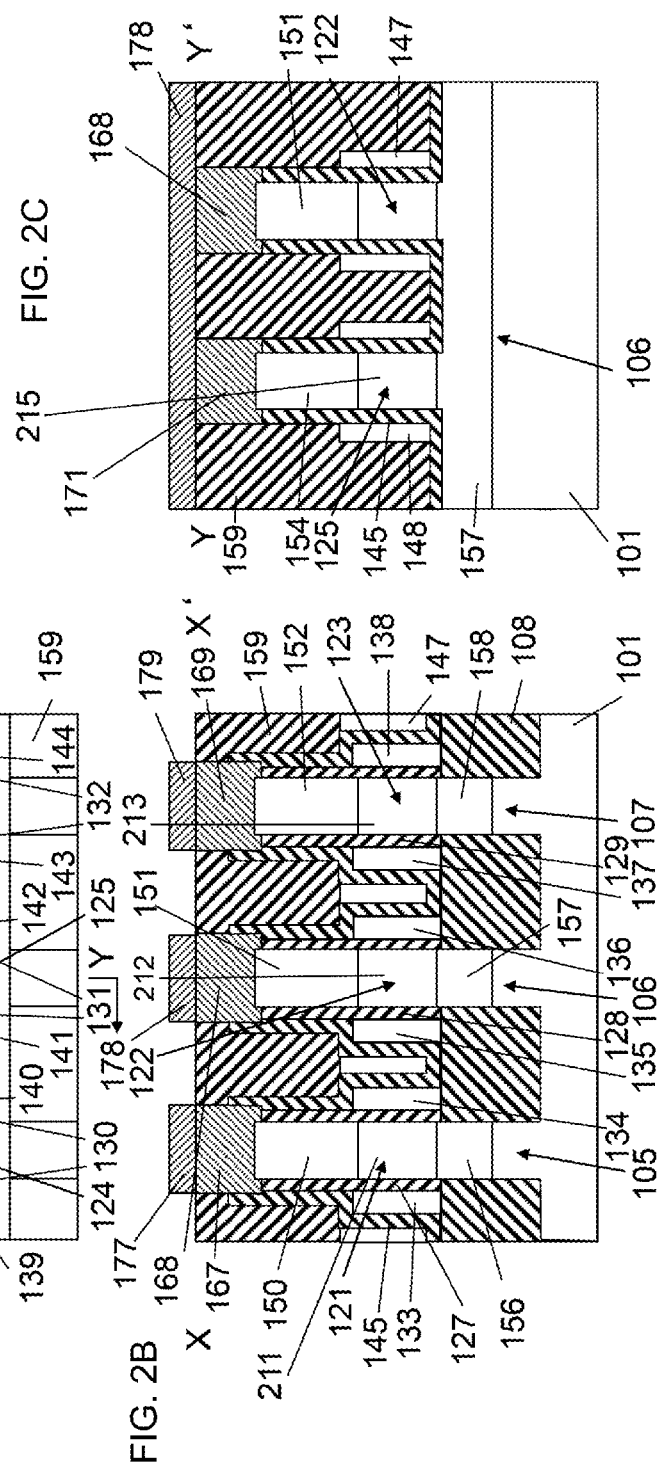

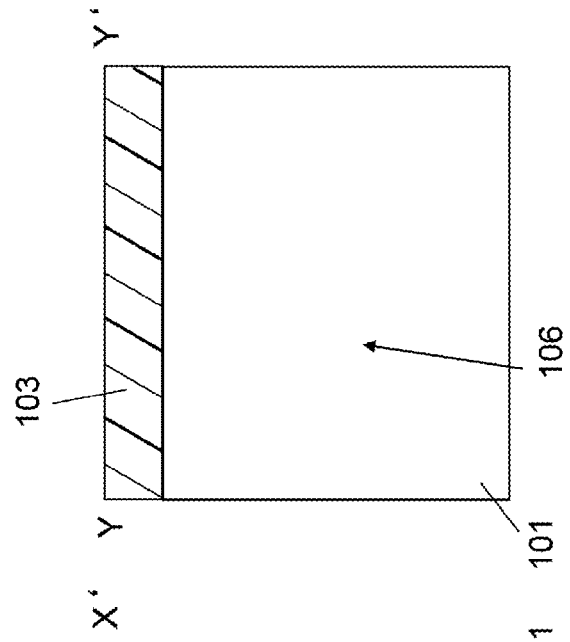
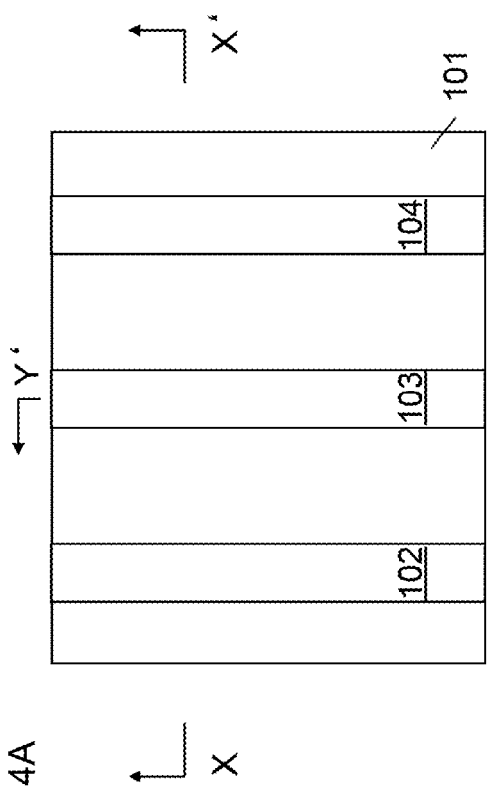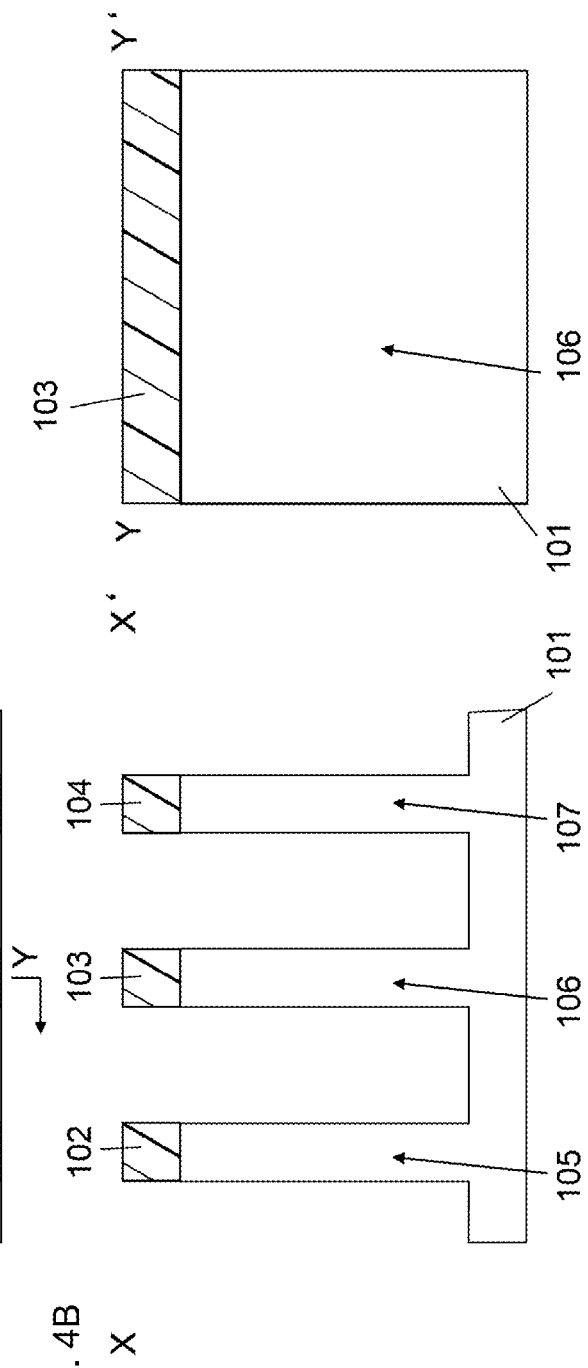

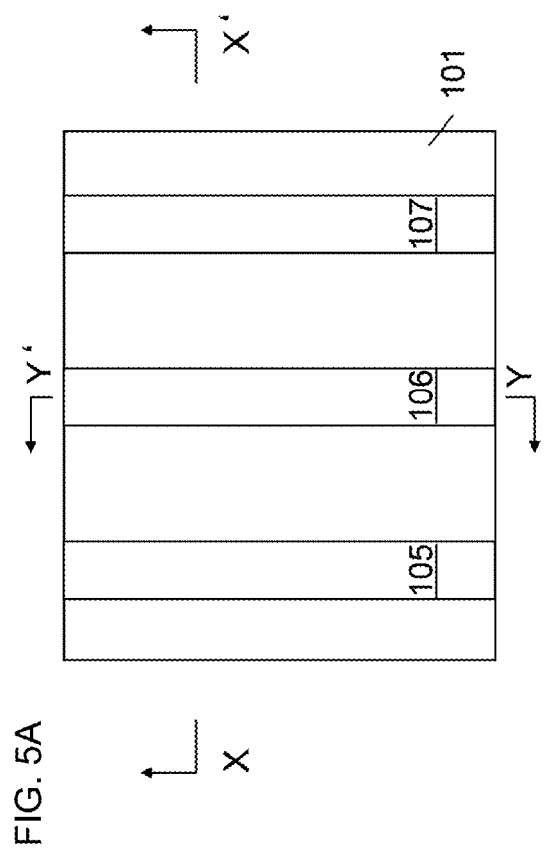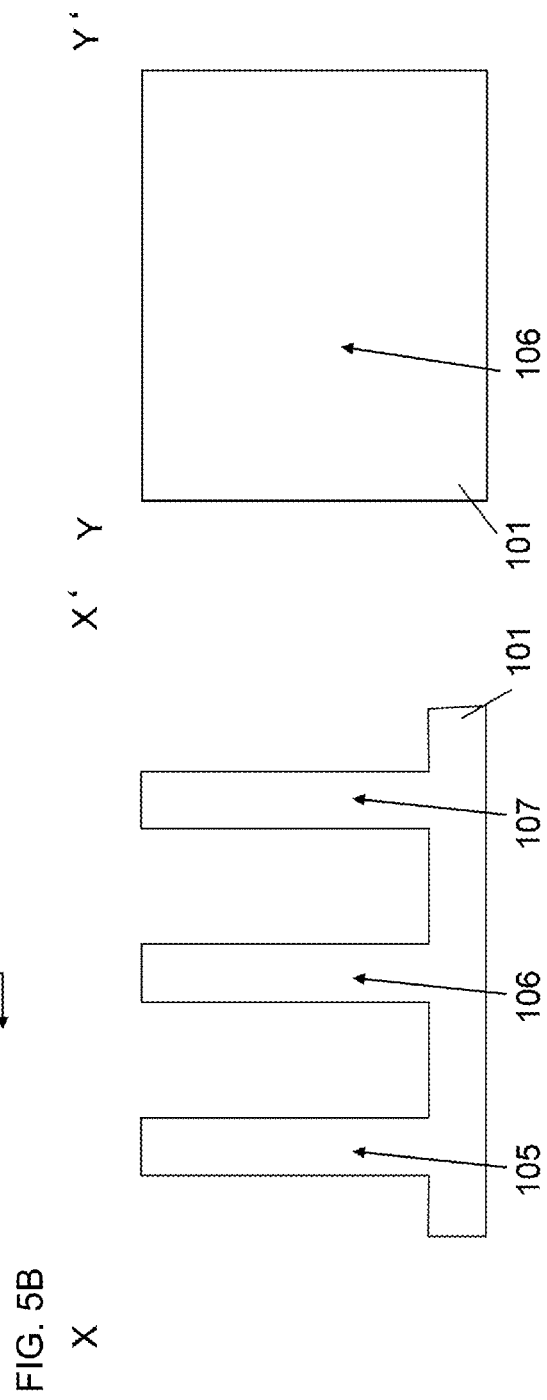

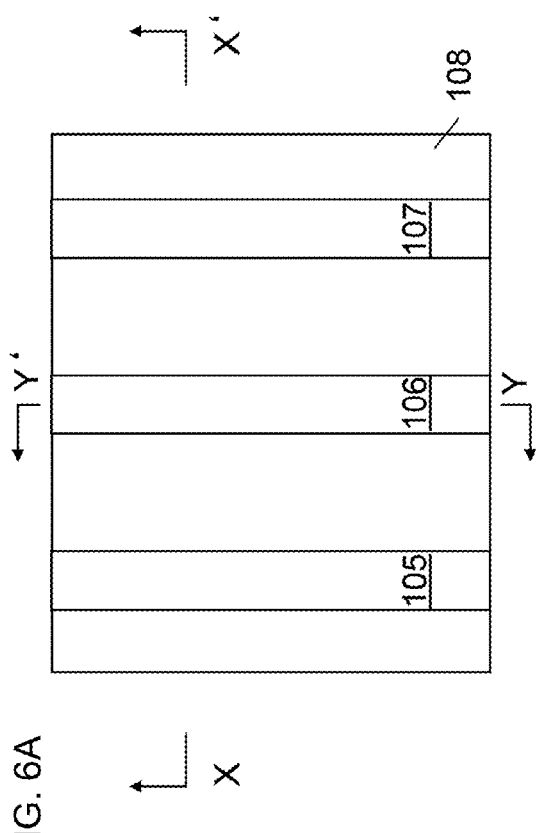
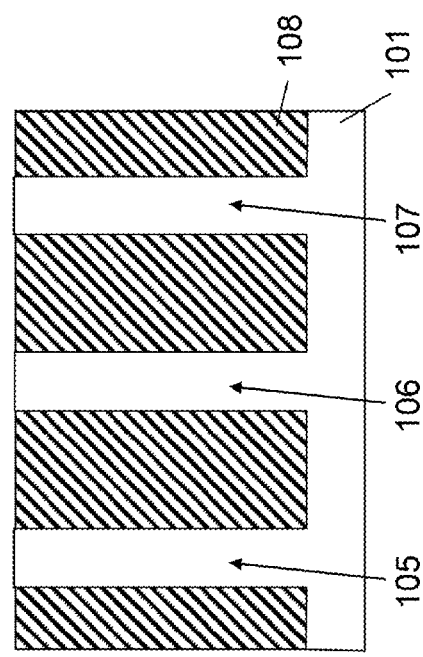
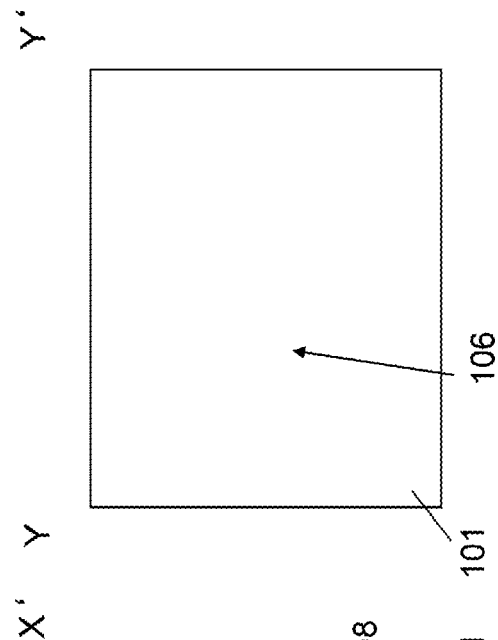
FIG. 6A
FIG. 6B
FIG. 6C

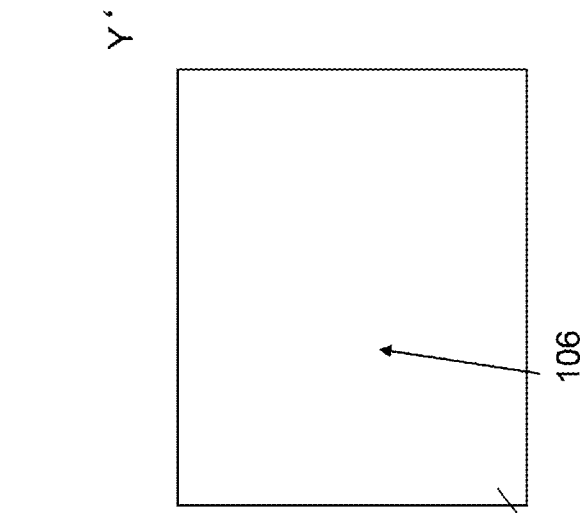
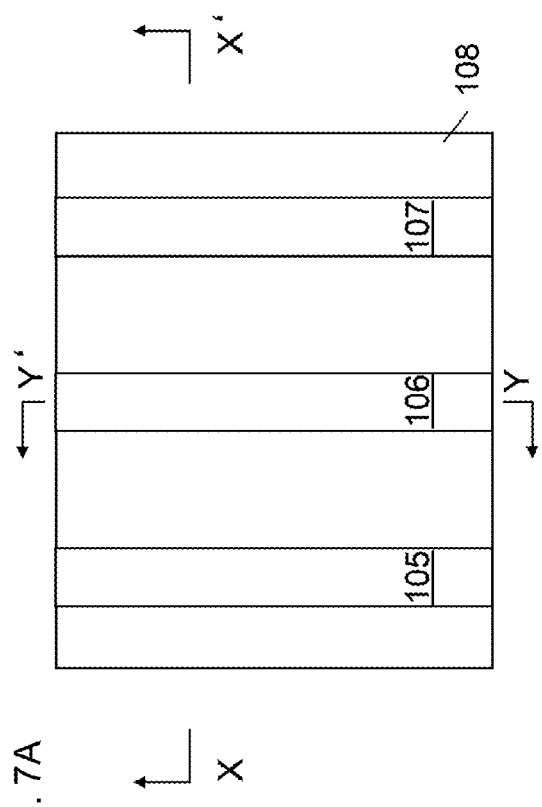
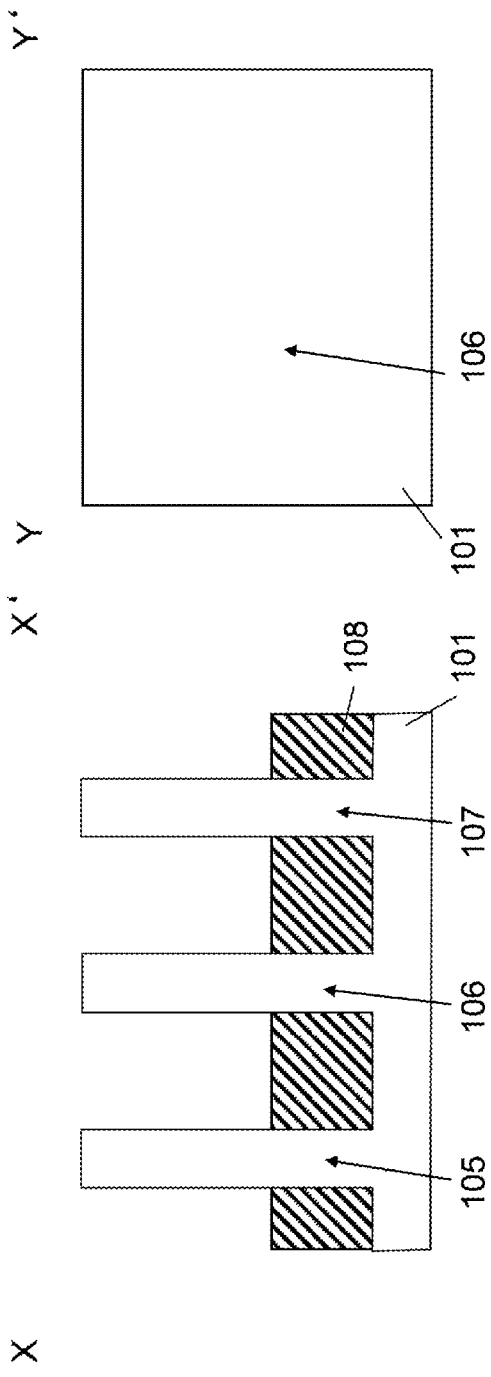

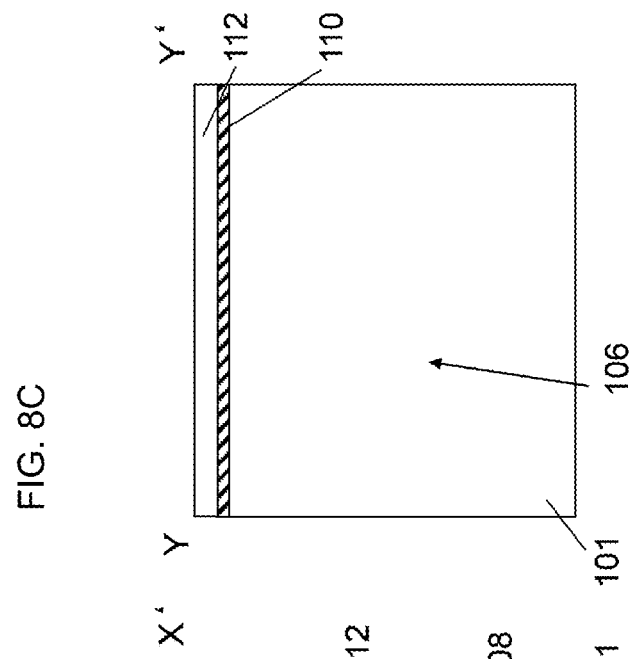
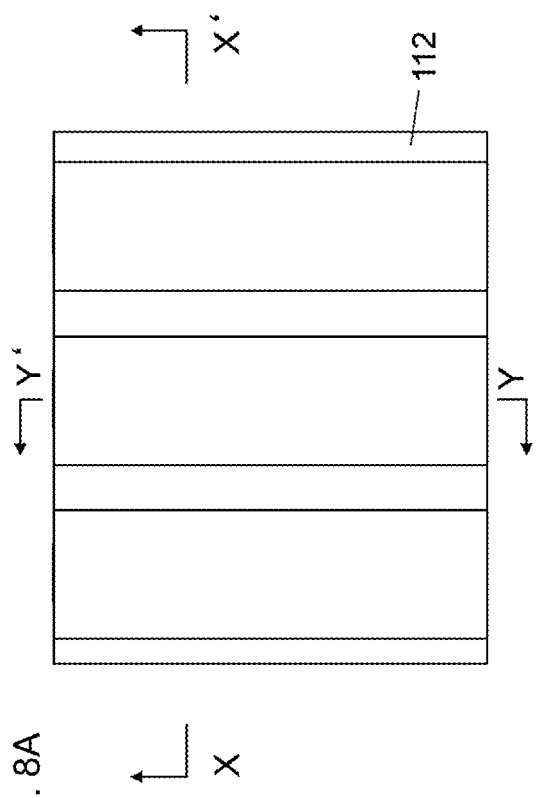
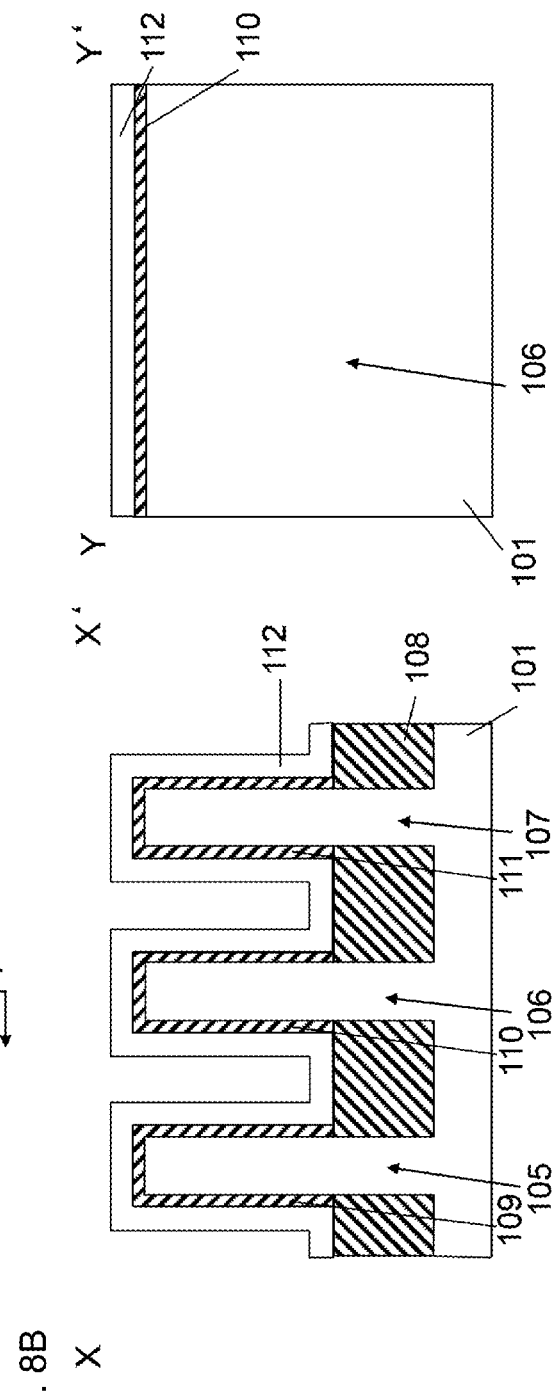

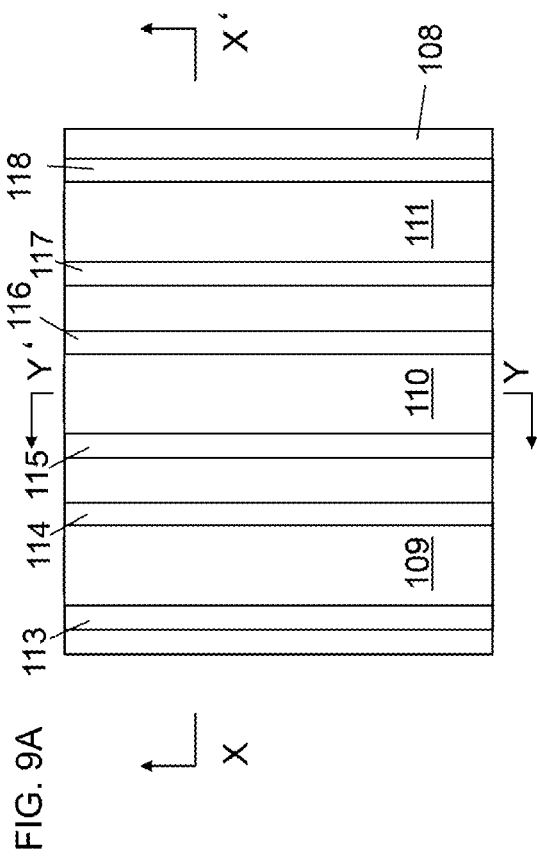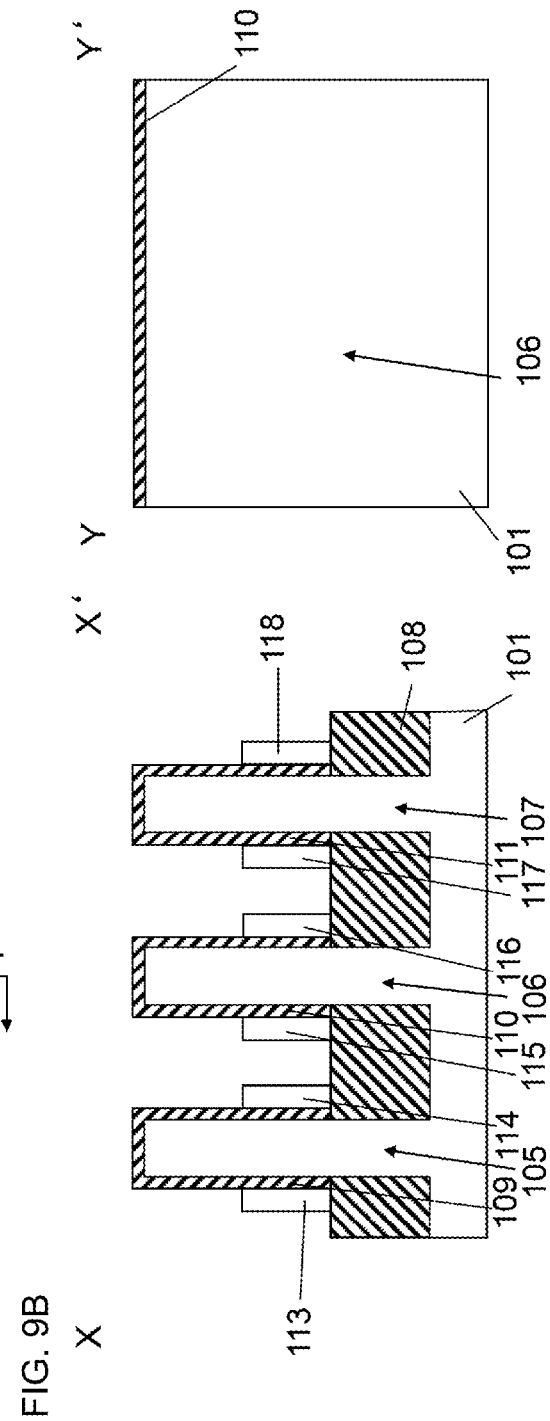

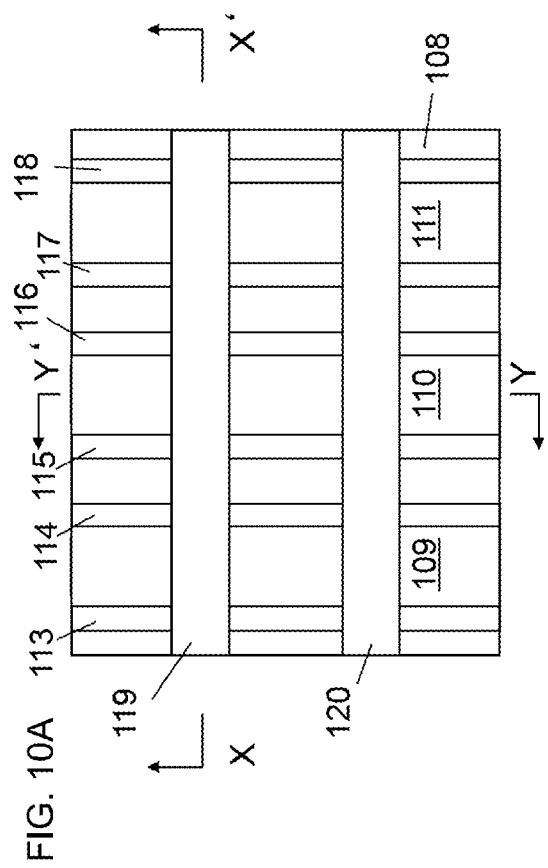
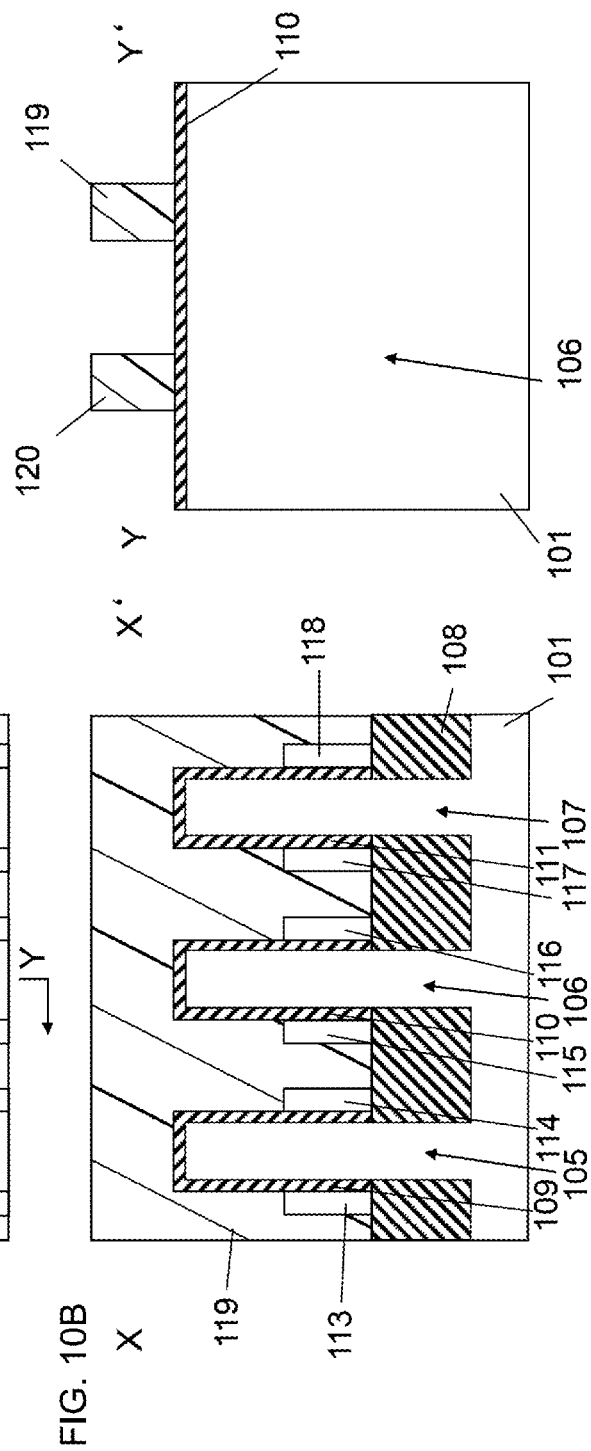
FIG. 10A
FIG. 10B
FIG. 10C

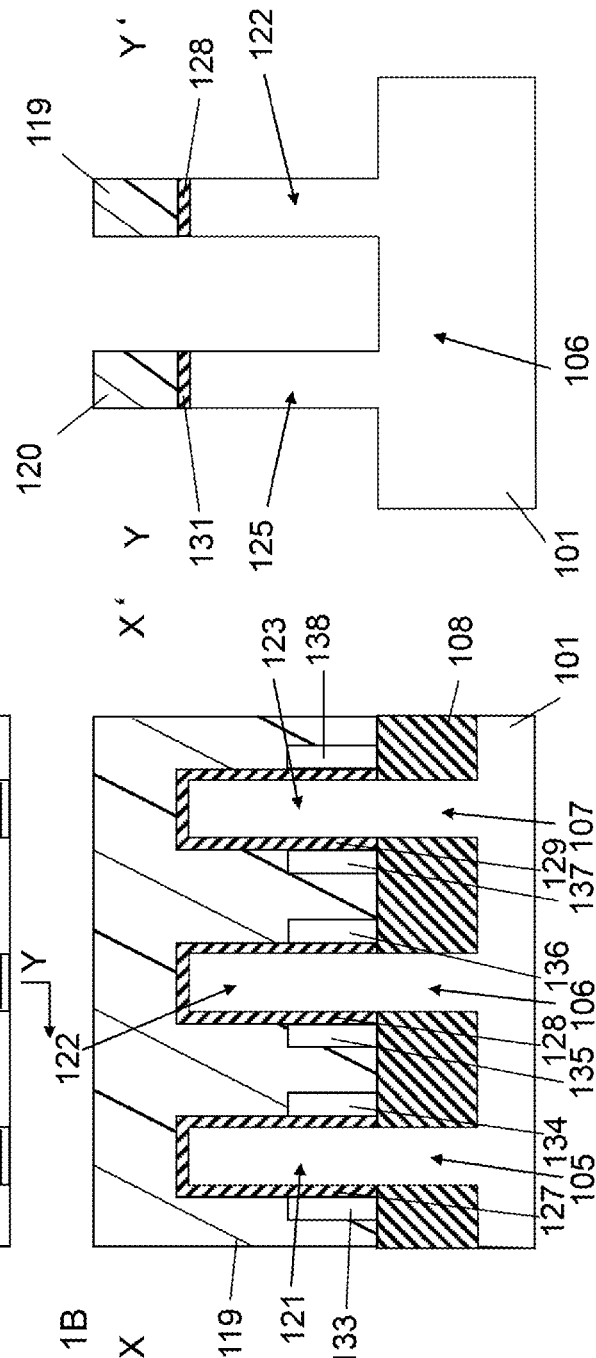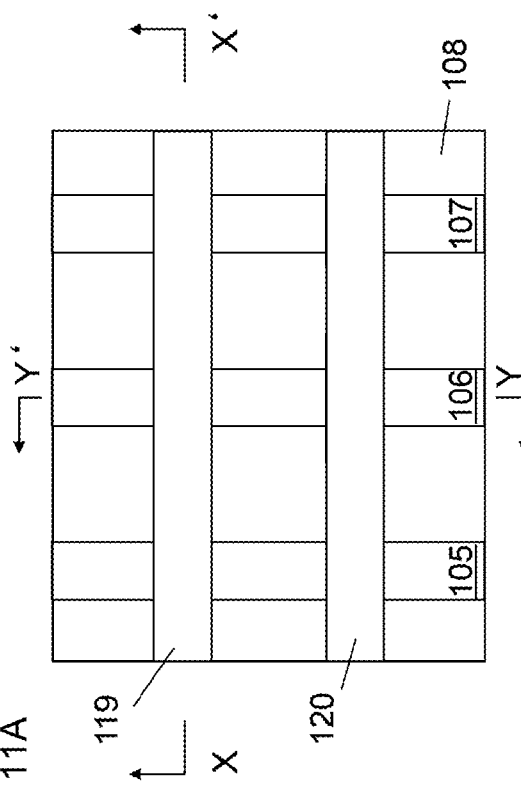

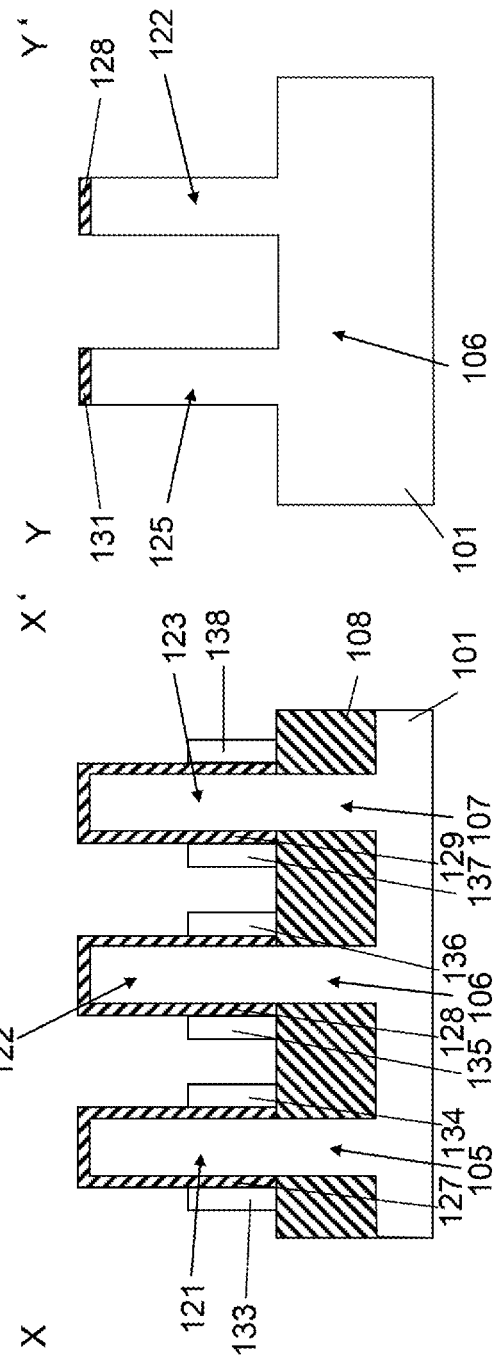

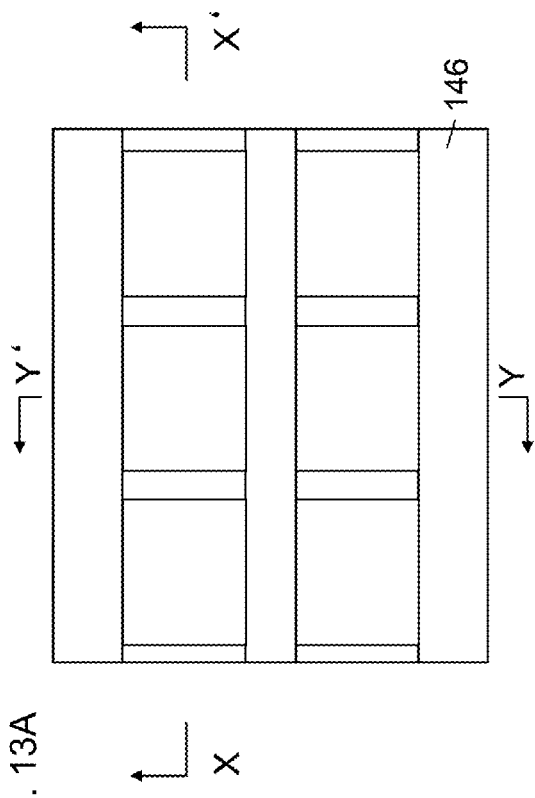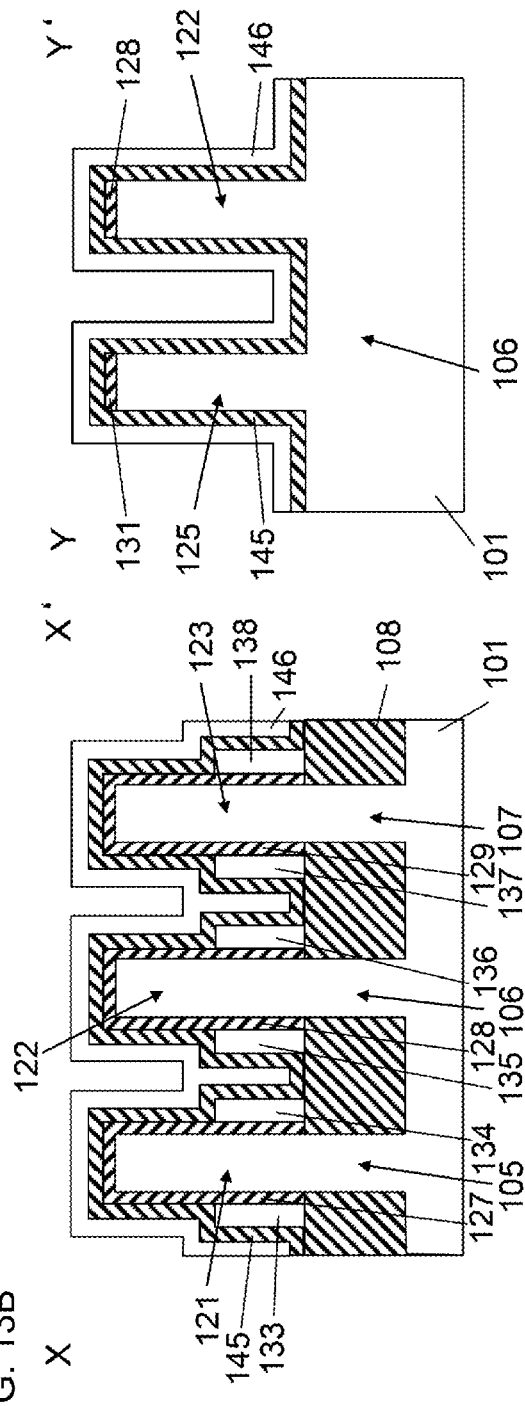

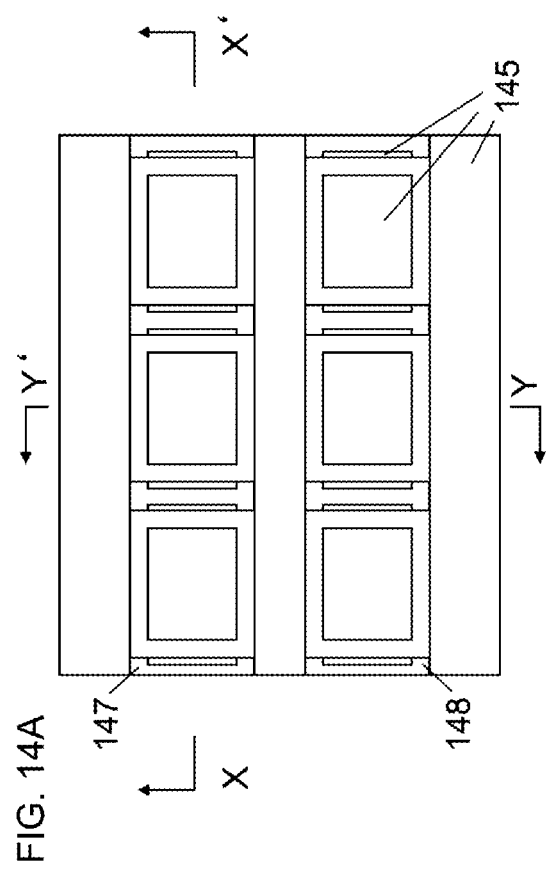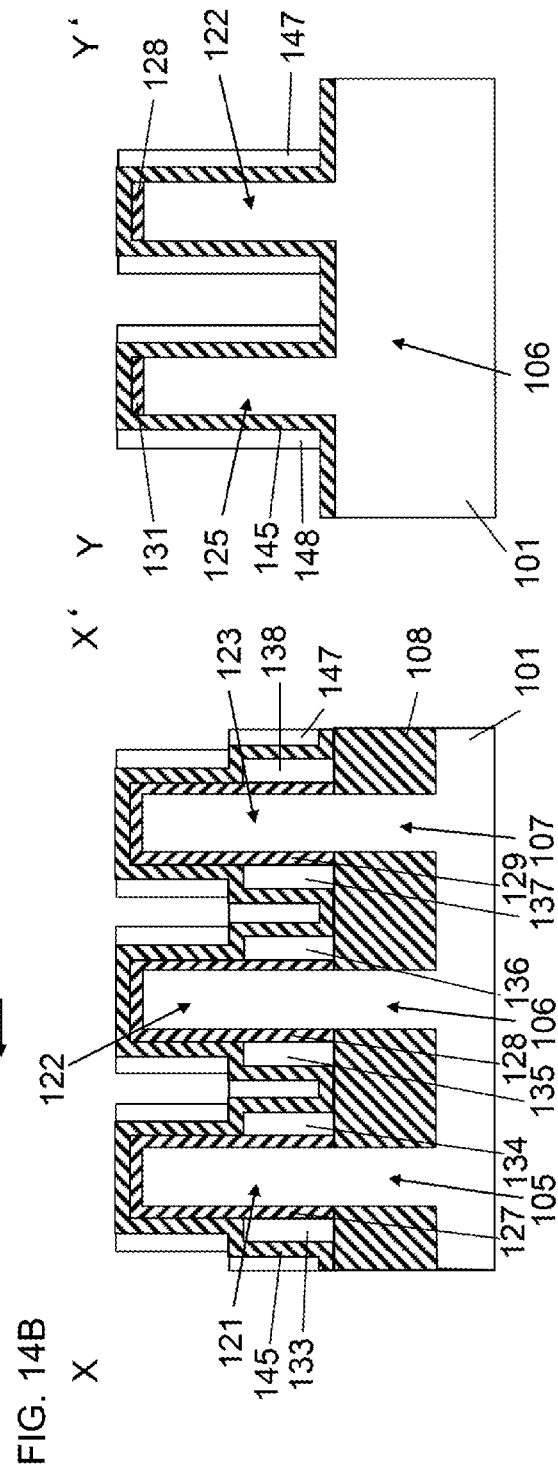

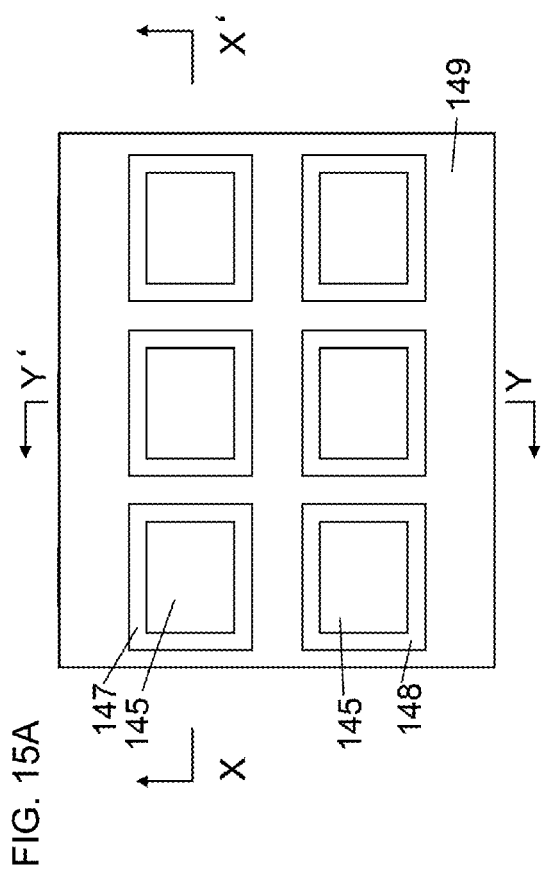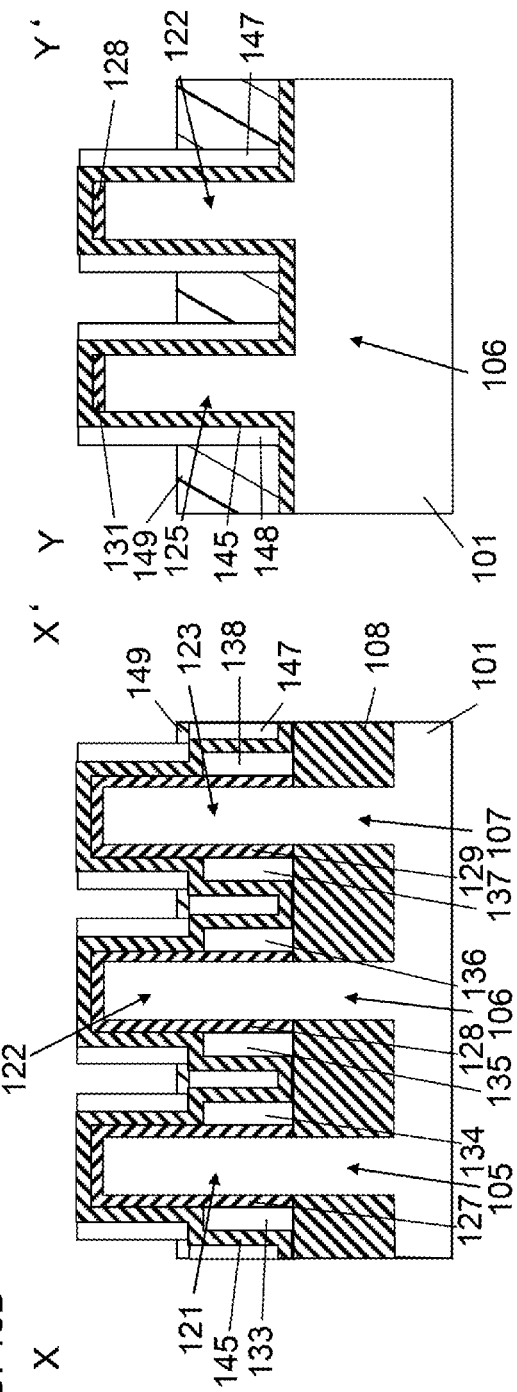

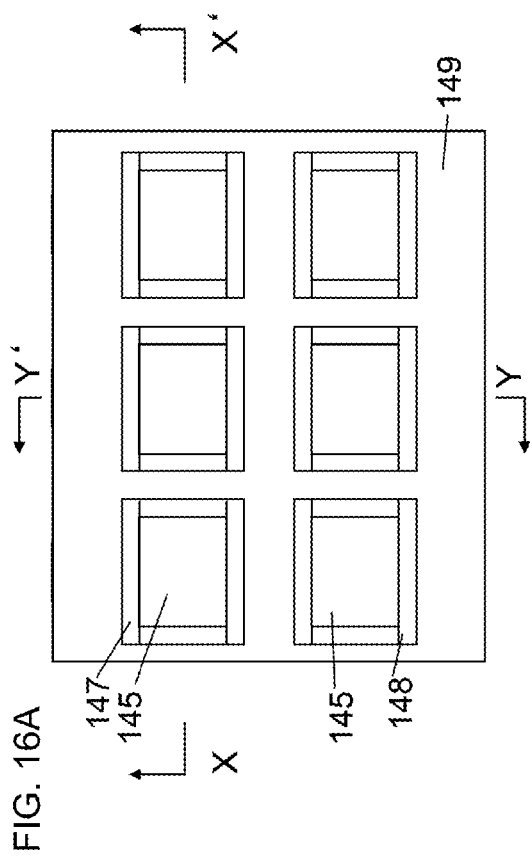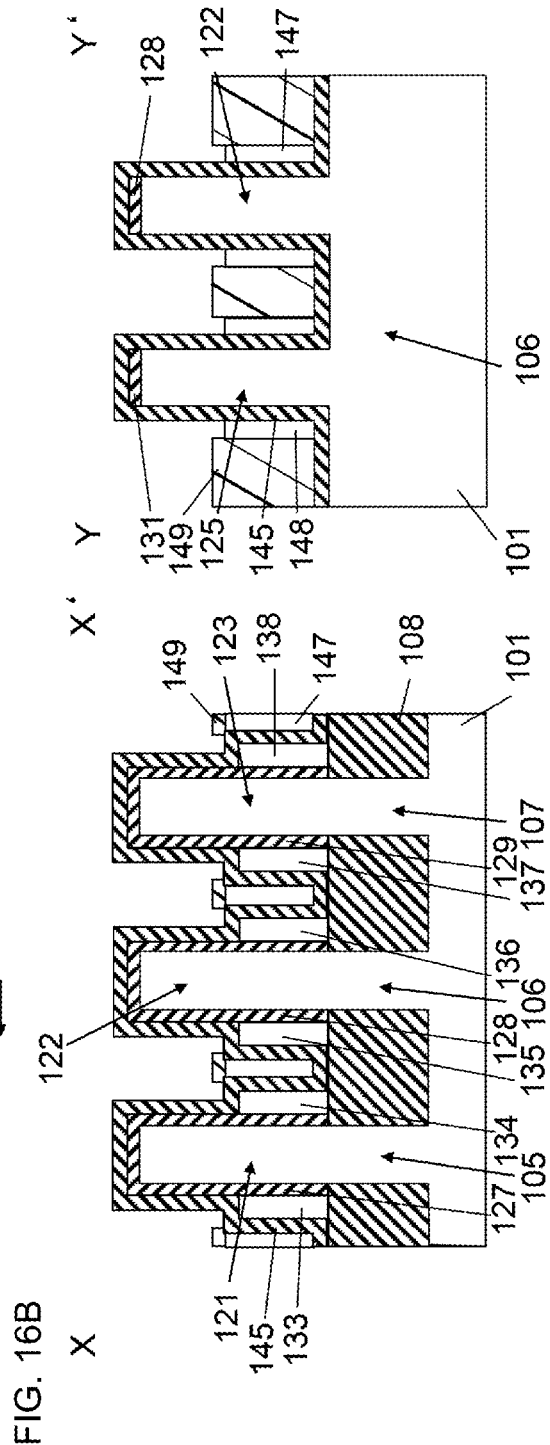

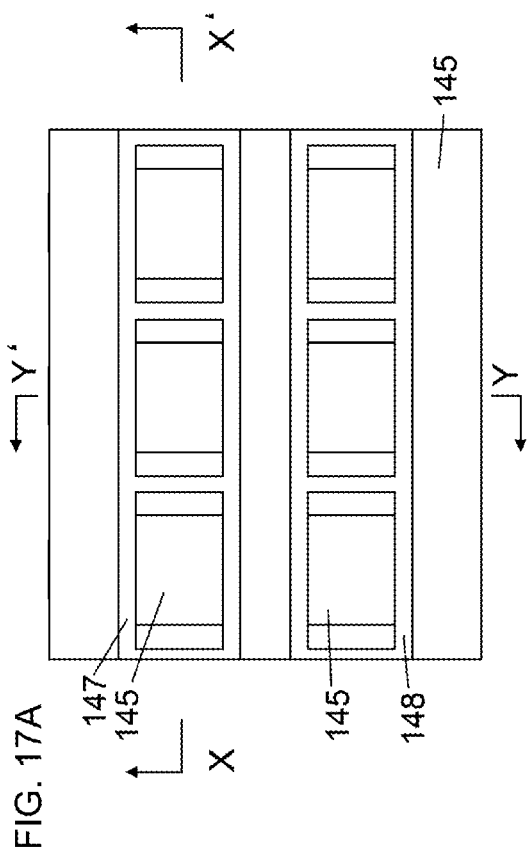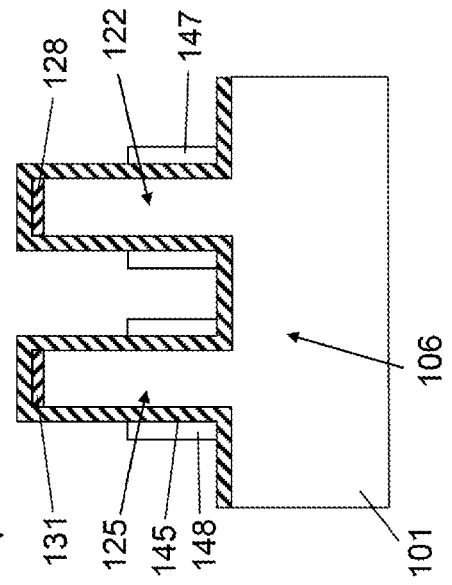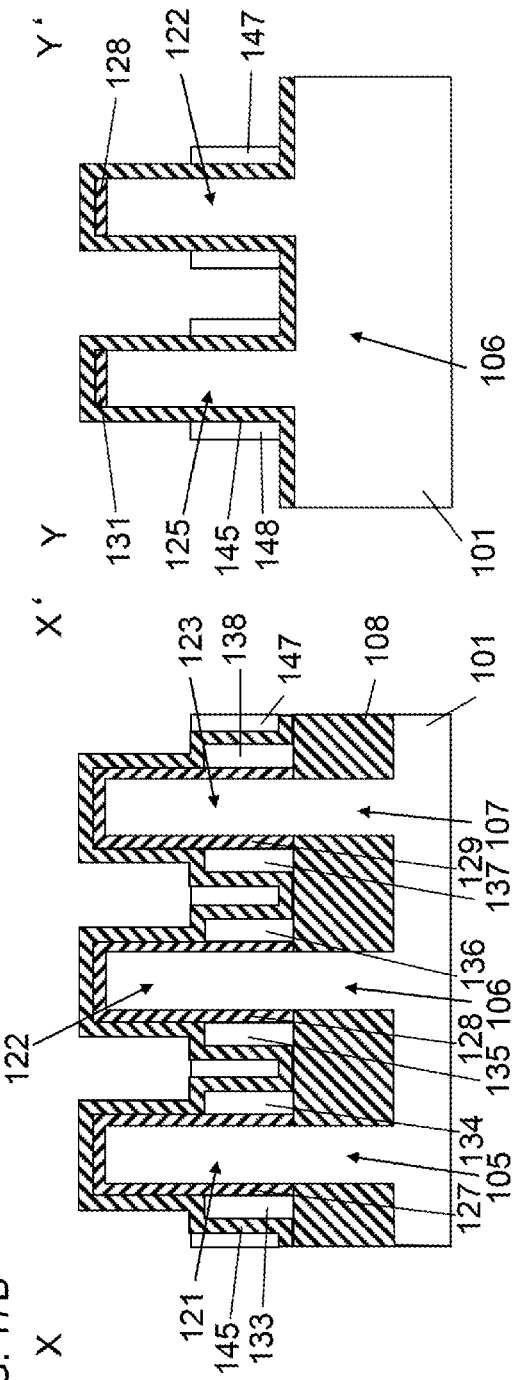

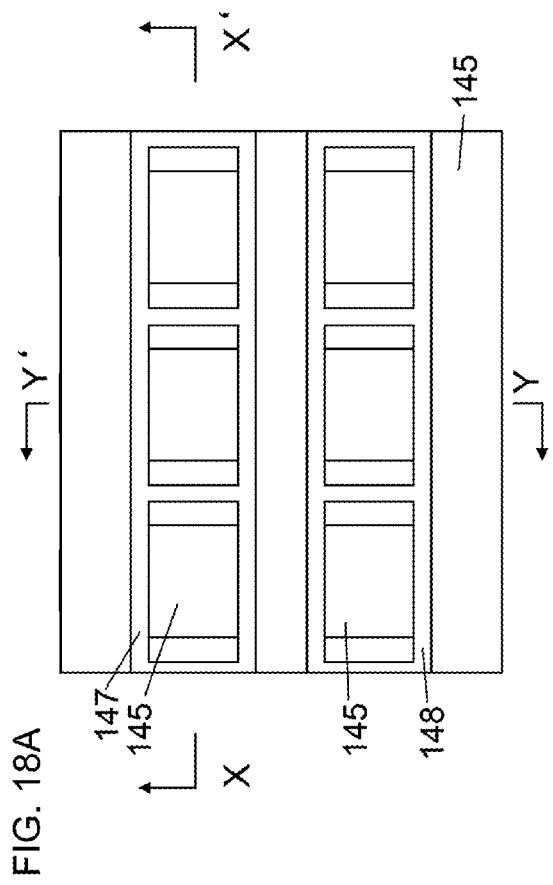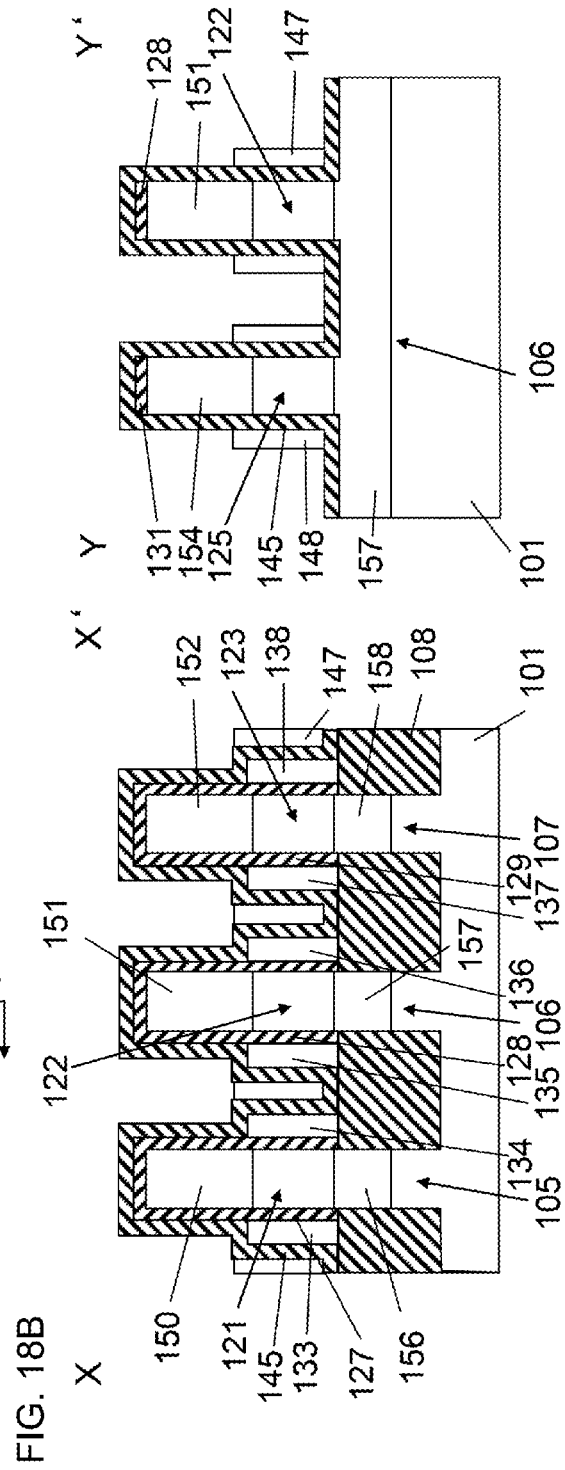
FIG. 18A
FIG. 18B
FIG. 18C

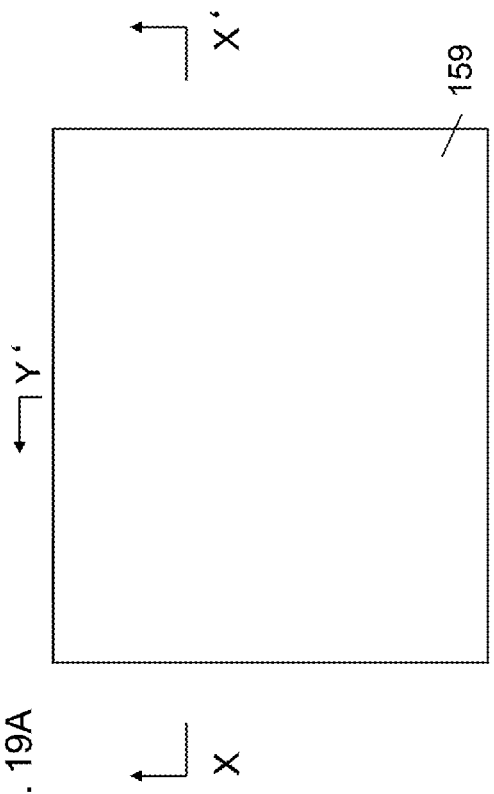
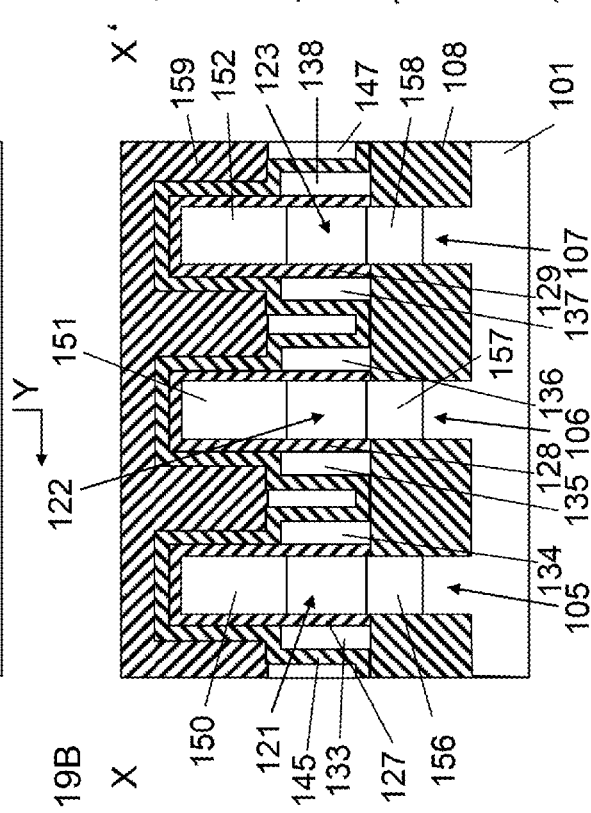
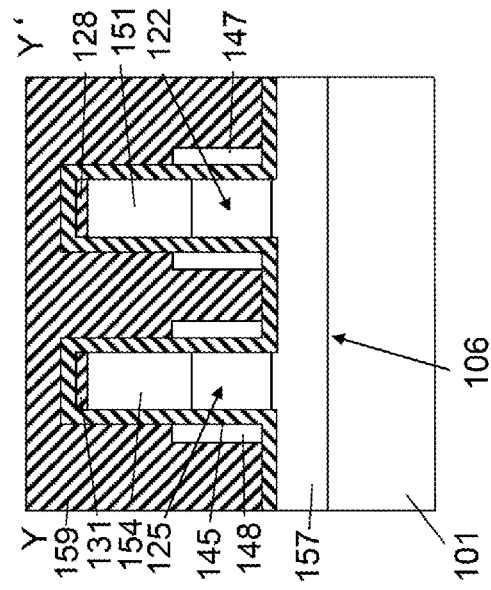
FIG. 19A
FIG. 19B
FIG. 19C

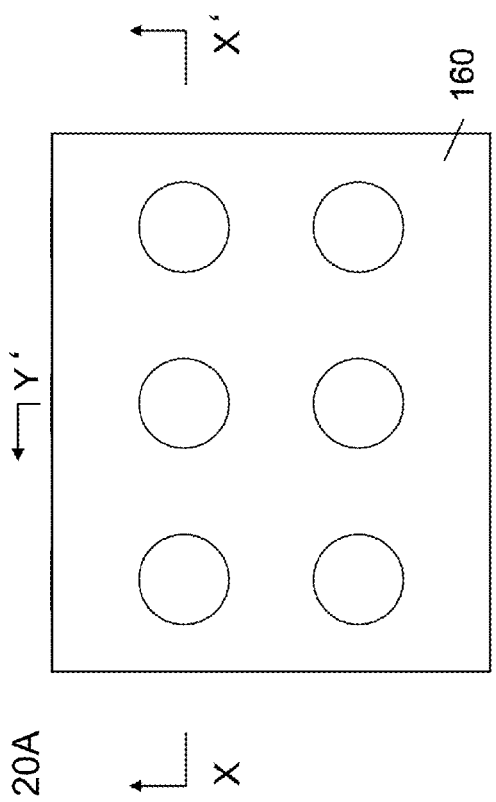
FIG. 20A
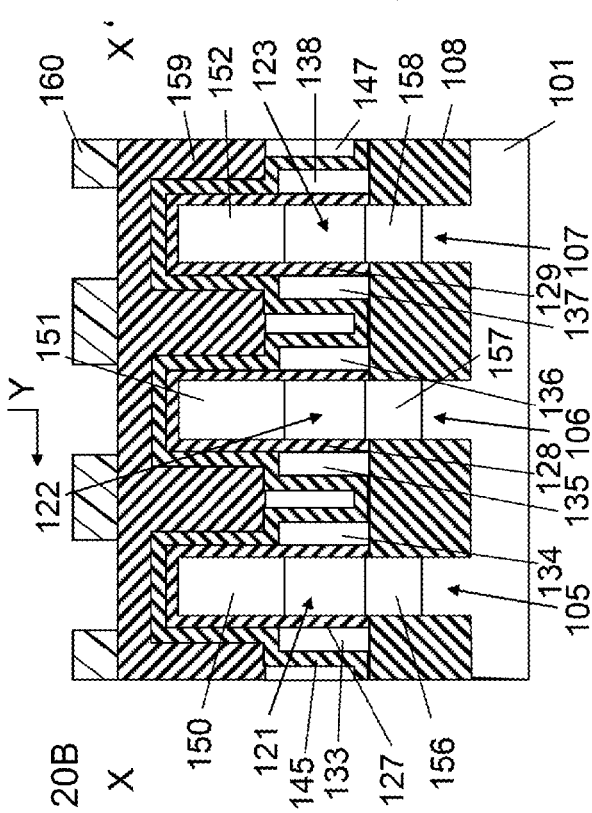
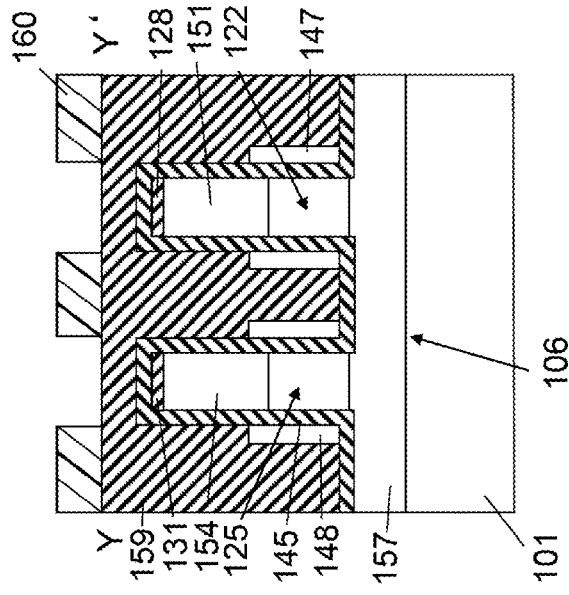

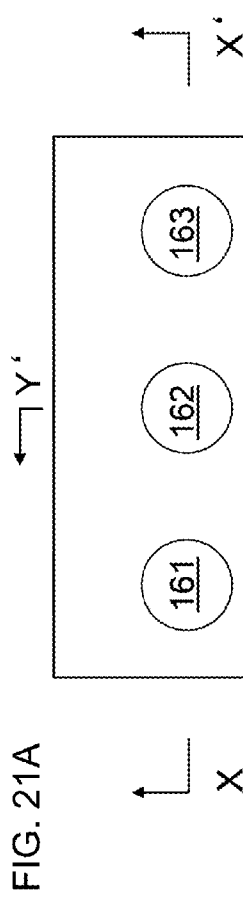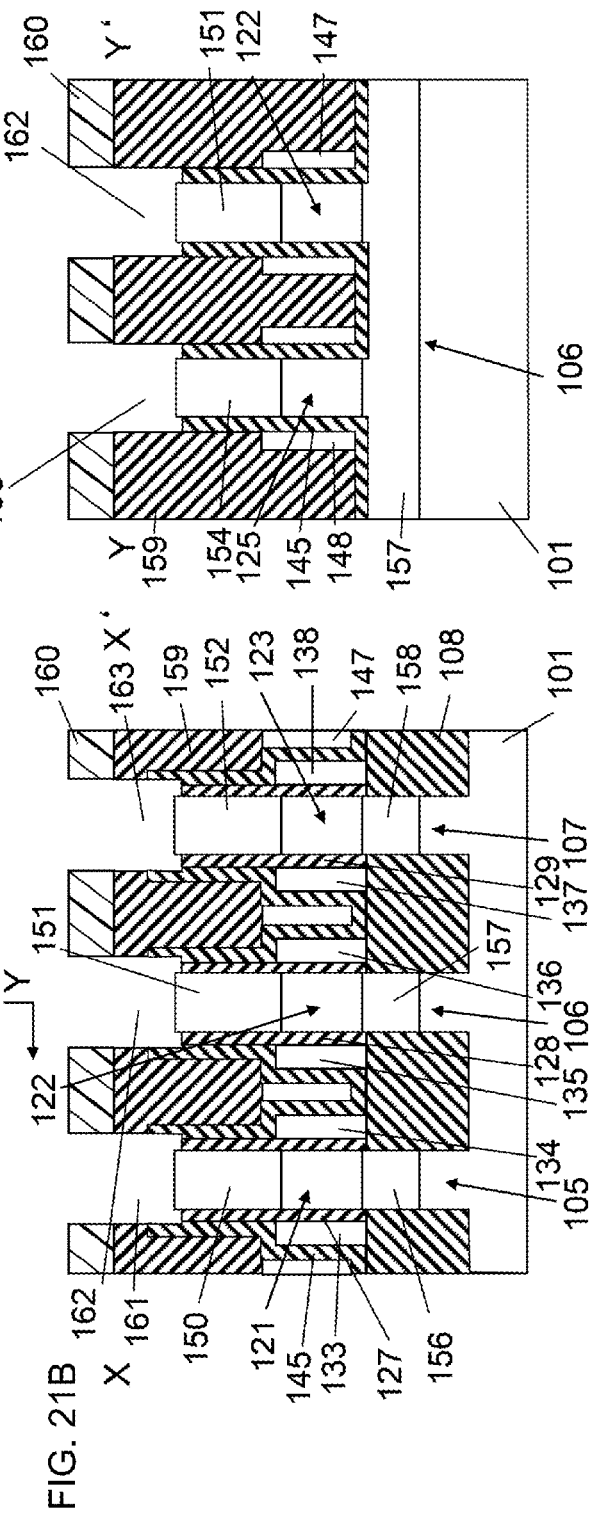
FIG. 21A
FIG. 21B
FIG. 21C

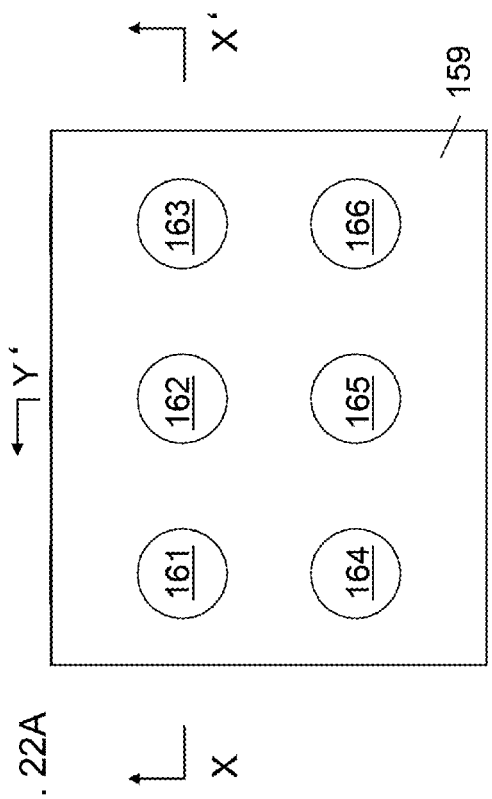
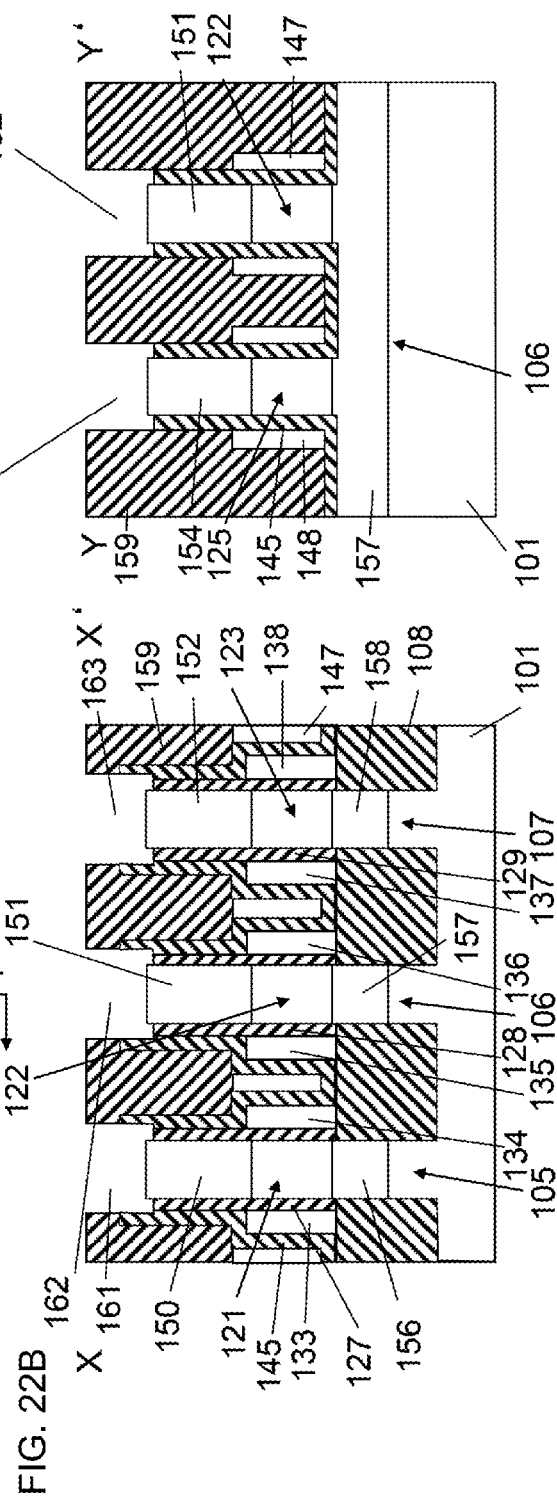
FIG. 22A
FIG. 22B
FIG. 22C

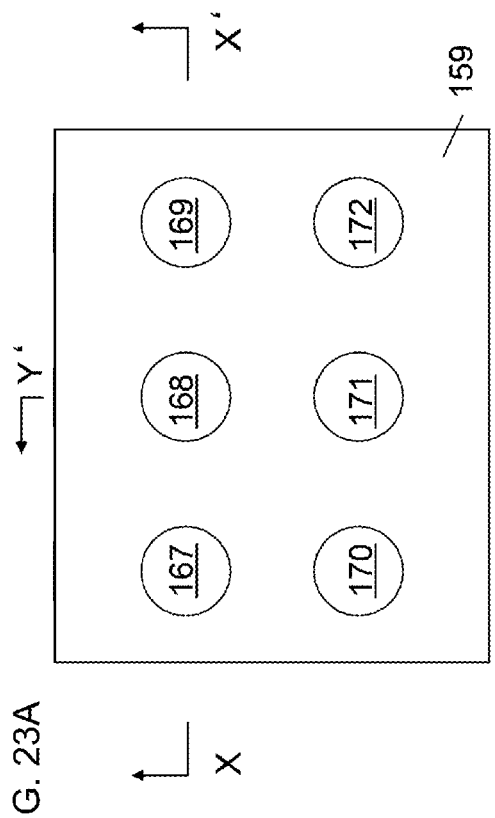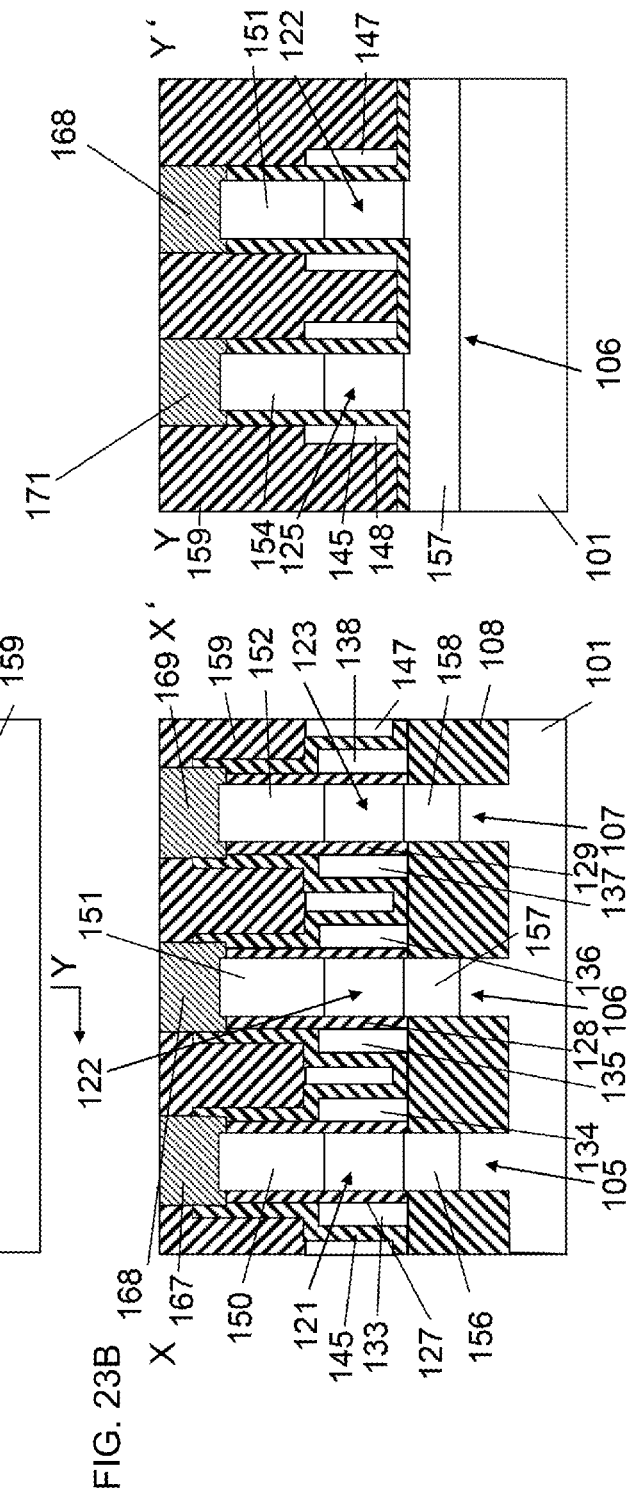

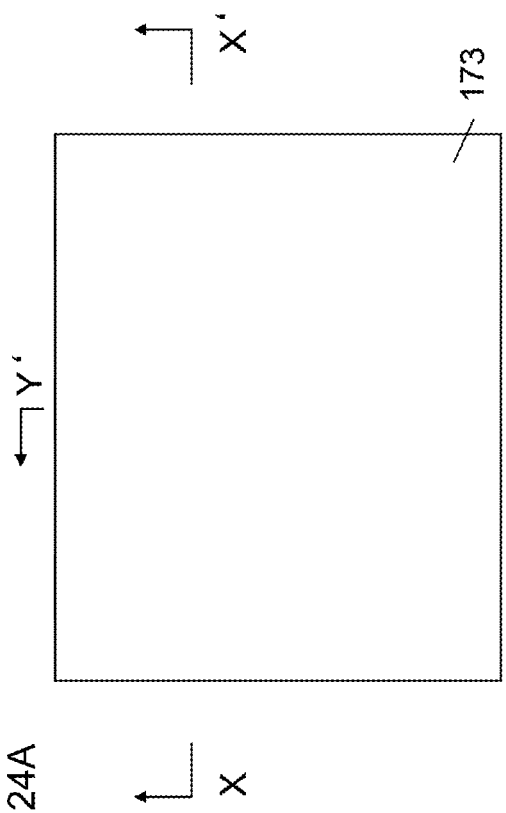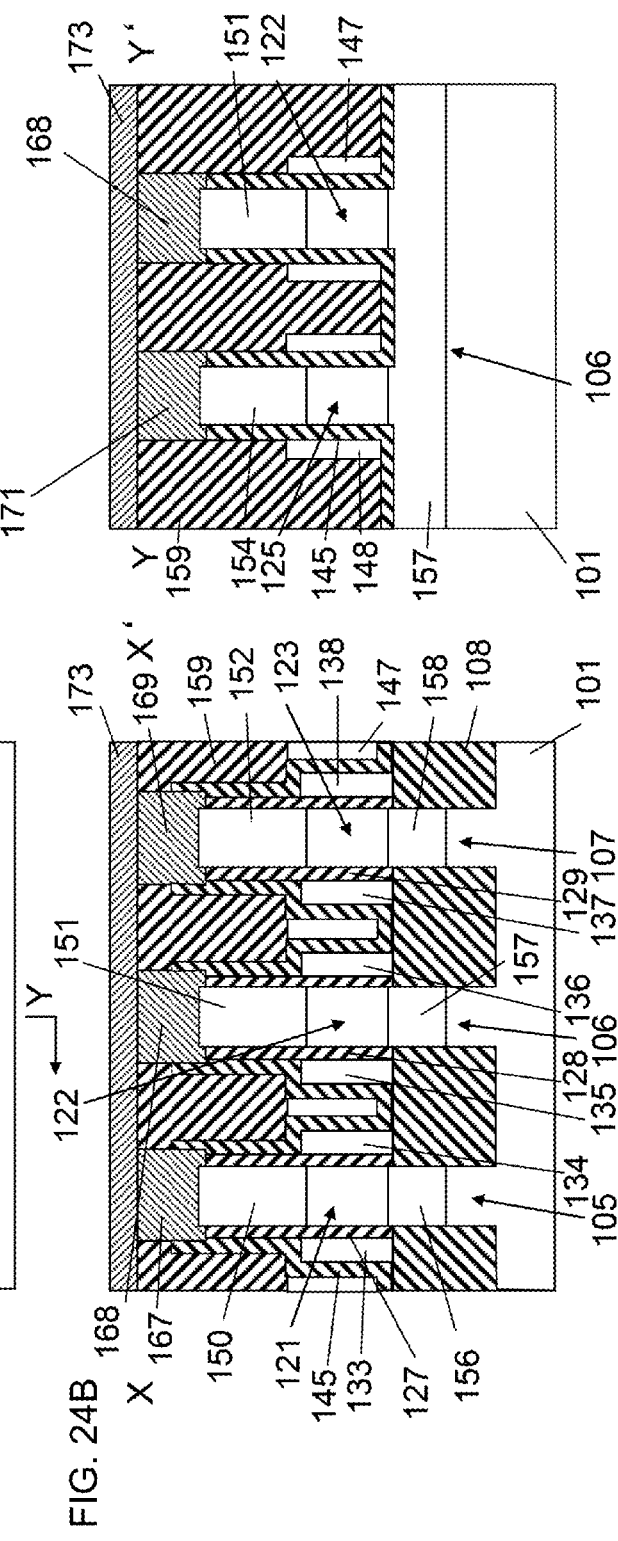

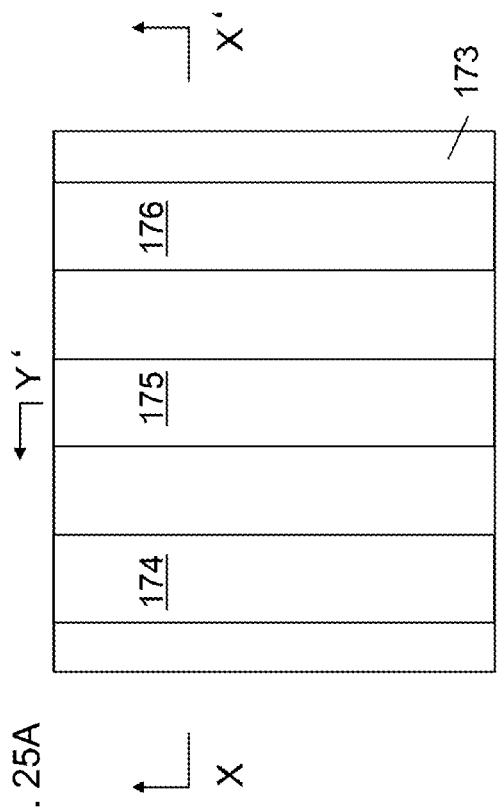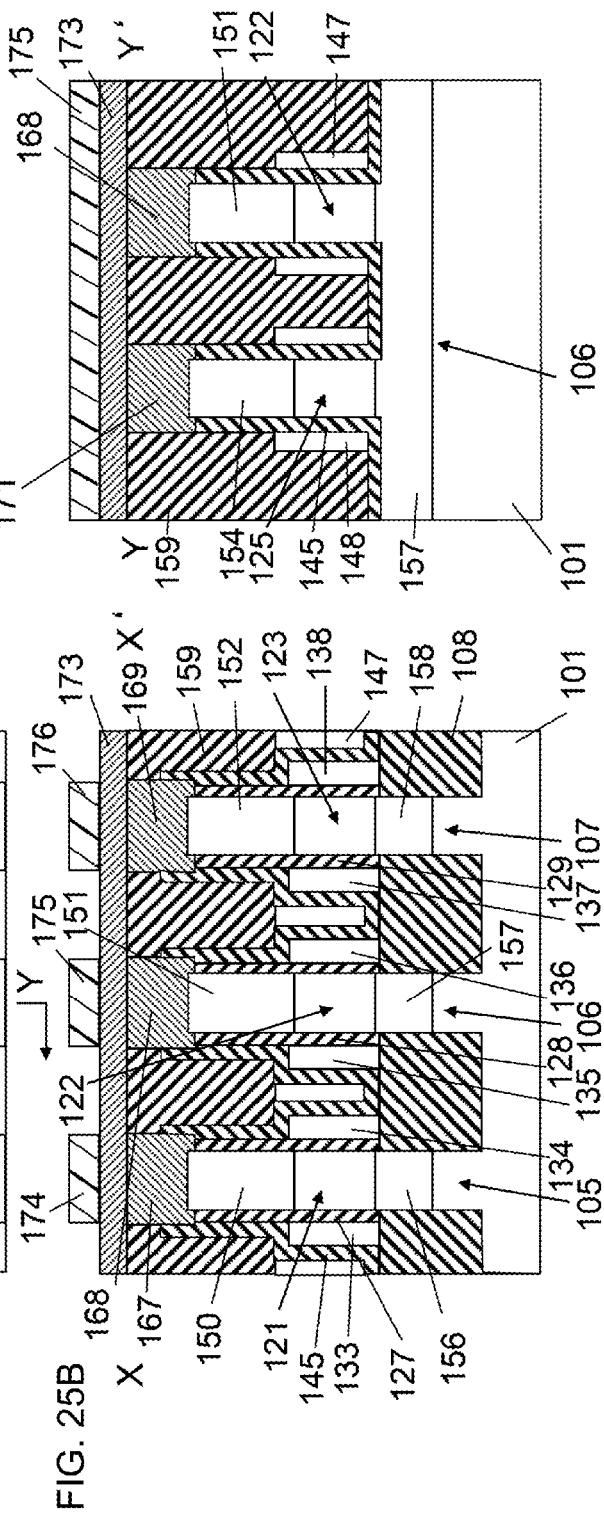

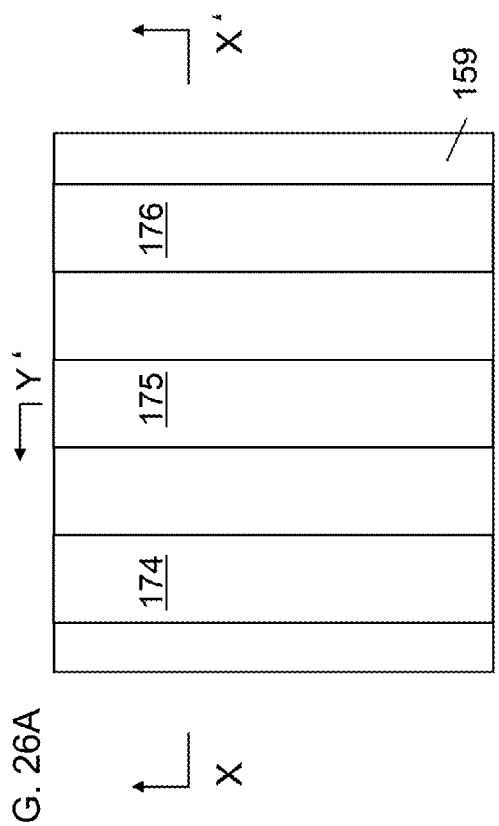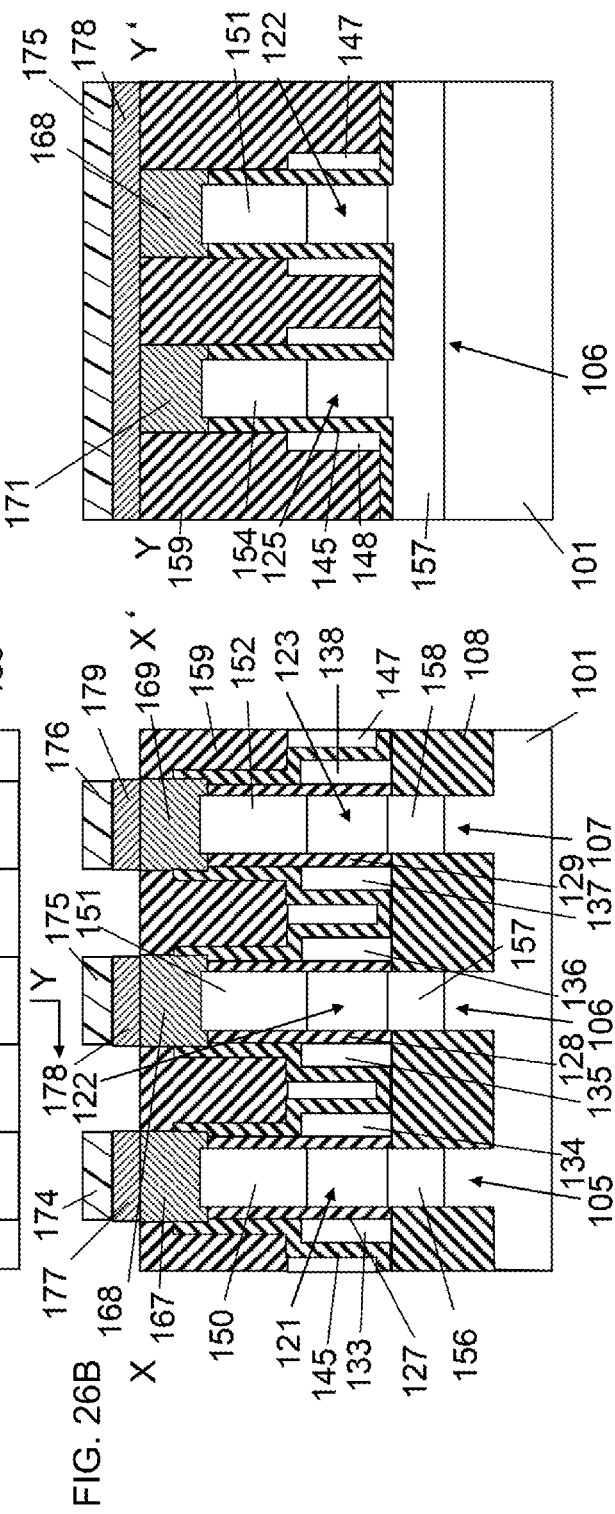

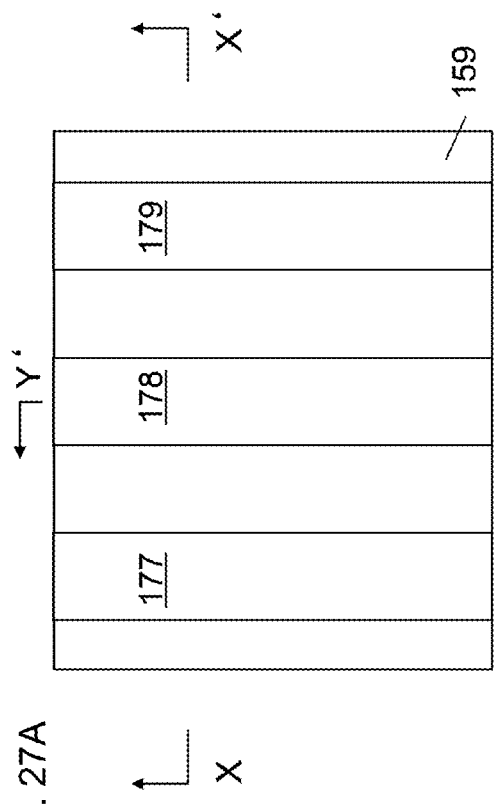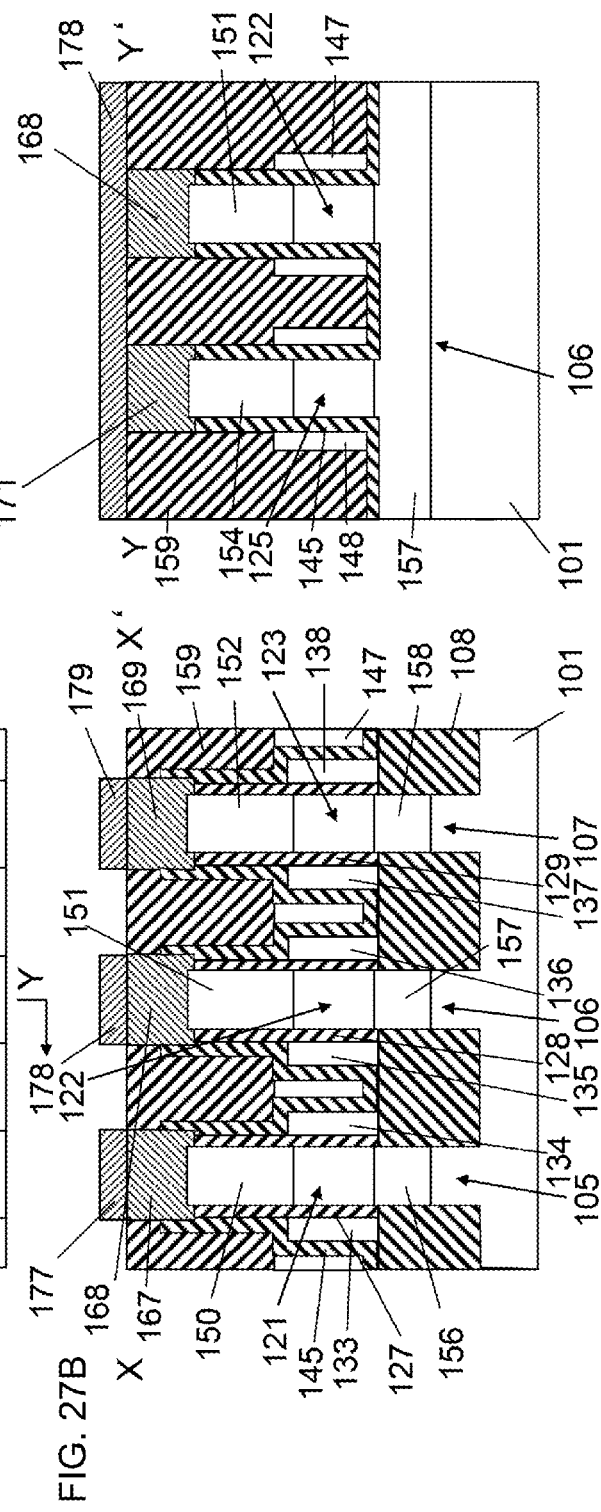

SEMICONDUCTOR DEVICE AND METHOD FOR PRODUCING THE SAME

CROSS REFERENCE TO RELATED APPLICATION

This application is a continuation, under 35 U.S.C. §120, of copending patent application Ser. No. 14/018,614, filed Sep. 5, 2013, which claimed the benefit, under 35 U.S.C. §119(e), of provisional patent application No. 61/698,054, filed Sep. 7, 2012; the prior applications are herewith incorporated by reference.

BACKGROUND OF THE INVENTION

1. Field of the Invention

The present invention relates to a semiconductor device and a method for producing the semiconductor device.

2. Description of the Related Art

There has been proposed a flash memory that includes a memory cell including a floating gate and a control gate formed on a side wall of a pillar-shaped semiconductor layer, which is formed on a surface of a semiconductor substrate, so as to surround the pillar-shaped semiconductor layer. In this flash memory, the capacitance between the floating gate and the control gate can be increased with a small area occupied on the substrate, and the flash memory has high writing and erasing efficiencies (e.g., refer to Japanese Unexamined Patent Application Publication No. 8-148587).

In such a structure in which the floating gate surrounds the pillar-shaped semiconductor layer, the control gate surrounds the floating gate. Therefore, the width of control gate lines increases and the distance between the control gate lines decreases when a memory cell array is formed, which increases the capacitance between the control gate lines. On the other hand, if the distance between the control gate lines is increased, the degree of integration decreases.

In order to increase the capacitance between the floating gate and the control gate, there has been proposed a tri-control gate surrounding gate transistor (TCG-SGT) flash memory cell (e.g., refer to Takuya Ohba, Hiroki Nakamura, Hiroshi Sakuraba, Fujio Masuoka, "A novel tri-control gate surrounding gate transistor (TCG-SGT) nonvolatile memory cell for flash memory", Solid-State Electronics, Vol. 50, No. 6, pp. 924-928, June 2006).

The TCG-SGT flash memory cell has a structure in which the control gate covers not only side surfaces but also an upper surface and a lower surface of the floating gate. Therefore, the capacitance between the floating gate and the control gate can be increased, whereby writing and erasing are easily conducted. However, such a structure in which the control gate covers the upper surface and lower surface of the floating gate is not easily produced.

In order to decrease the parasitic capacitance between a gate line and a substrate, a first insulating film is used in known MOS transistors. For example, in a FinFET (e.g., refer to High performance 22/20 nm FinFET CMOS devices with advanced high-K/metal gate scheme, IEDM2010, CC. Wu, et. al, 27.1.1-27.1.4.), a first insulating film formed around a fin-shaped semiconductor layer is etched back to expose the fin-shaped semiconductor layer, whereby the parasitic capacitance between the gate line and the substrate is decreased.

In order to decrease the parasitic capacitance between the gate line and the substrate, it is also effective in SGT (surrounding gate transistor) flash memory cells to use such a first insulating film. However, in SGT flash memory cells, some improvement for forming the pillar-shaped semiconductor layer, in addition to the fin-shaped semiconductor layer, is required.

SUMMARY OF THE INVENTION

In view of the foregoing, it is an object of the present invention to provide a semiconductor device in which the capacitance between control gate lines can be decreased and a high degree of integration is realized.

With the objects of the invention in view there is provided, in accordance with one aspect of the invention, a semiconductor device, comprising:

a pillar-shaped semiconductor layer;

two floating gates arranged so as to sandwich the channel region; and a control gate line disposed so as to surround said two floating gates and said channel region; and wherein said two floating gates are arranged in a direction in which said control gate line extends so as to sandwich said channel region.

A semiconductor device according to a further aspect of the present invention includes:

a pillar-shaped semiconductor layer on a substrate, the pillar-shaped semiconductor layer including a first diffusion layer, a channel region, and a second diffusion layer formed in that order;

floating gates that respectively extend in two symmetrical directions so as to sandwich the pillar-shaped semiconductor layer;

a control gate line that extends in two symmetrical directions other than the two directions so as to sandwich the pillar-shaped semiconductor layer; and a tunnel insulating film formed between the pillar-shaped semiconductor layer and each of the floating gates, wherein the control gate line is formed on an inter-polysilicon insulating film disposed outside the floating gates in the directions in which the control gate line extends, and the control gate line is formed on an inter-polysilicon insulating film disposed outside the pillar-shaped semiconductor layer without disposing the floating gates in a direction perpendicular to the directions in which the control gate line extends and to a direction in which the pillar-shaped semiconductor layer extends.

The widths of the floating gates in a direction perpendicular to the directions in which the control gate line extends are preferably equal to the width of the pillar-shaped semiconductor layer in the direction perpendicular to the directions in which the control gate line extends.

Three side walls of each of the floating gates are preferably surrounded by the control gate line.

The semiconductor device preferably further includes a fin-shaped semiconductor layer including an upper portion in which the first diffusion layer is formed, wherein the width of the pillar-shaped semiconductor layer in the directions in which the control gate line extends is preferably equal to the width of the fin-shaped semiconductor layer, and a direction in which the fin-shaped semiconductor layer extends is preferably perpendicular to the directions in which the control gate line extends.

A method for producing a semiconductor device according to a further aspect of the present invention includes:

a first step of forming a fin-shaped silicon layer on a silicon substrate and forming a first insulating film around the fin-shaped silicon layer; and after the first step, a second step of forming a tunnel insulating film around the fin-shaped silicon layer, forming a first polysilicon film around the tunnel insulating film, etching the first polysilicon film so that the first polysilicon film is made remain on a side wall of the fin-shaped silicon layer, forming a first resist in a direction perpendicular to a direction in which the fin-shaped silicon layer extends, and etching the fin-shaped silicon layer and the first polysilicon film to form a pillar-shaped silicon layer and floating gates respectively disposed in two symmetrical directions so as to sandwich the pillar-shaped silicon layer, wherein the widths of the floating gates are equal to the width of the pillar-shaped silicon layer.

The method preferably further includes, after the second step, a third step of depositing an inter-polysilicon insulating film, forming a second polysilicon film around the inter-polysilicon insulating film, and etching the second polysilicon film so that the second polysilicon film is made remain on side walls of the floating gates and the pillar-shaped silicon layer to form a control gate line.

The method preferably further includes, after the third step, a fourth step of forming a second resist, etching back the second resist to expose an upper portion of the control gate line, and removing the exposed upper portion of the control gate line by etching.

According to the present invention, there can be provided a semiconductor device in which the capacitance between control gate lines can be decreased and a high degree of integration is realized.

Other features which are considered as characteristic for the invention are set forth in the appended claims.

Although the invention is illustrated and described herein as embodied in semiconductor device and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1 is a perspective view of a semiconductor device according to an embodiment of the present invention;

FIG. 2A is a plan view of the semiconductor device according to an embodiment of the present invention, FIG. 2B is a sectional view taken along line X-X' of FIG. 2A, and FIG. 2C is a sectional view taken along line Y-Y' of FIG. 2A;

FIG. 4A is a plan view of the semiconductor device according to an embodiment of the present invention, FIG. 4B is a sectional view taken along line X-X' of FIG. 4A, and FIG. 4C is a sectional view taken along line Y-Y' of FIG. 4A;

FIG. 5A is a plan view of the semiconductor device according to an embodiment of the present invention, FIG. 5B is a sectional view taken along line X-X' of FIG. 5A, and FIG. 5C is a sectional view taken along line Y-Y' of FIG. 5A;

FIG. 6A is a plan view of the semiconductor device according to an embodiment of the present invention, FIG. 6B is a sectional view taken along line X-X' of FIG. 6A, and FIG. 6C is a sectional view taken along line Y-Y' of FIG. 6A;

FIG. 7A is a plan view of the semiconductor device according to an embodiment of the present invention, FIG. 7B is a sectional view taken along line X-X' of FIG. 7A, and FIG. 7C is a sectional view taken along line Y-Y' of FIG. 7A;

FIG. 8A is a plan view of the semiconductor device according to an embodiment of the present invention, FIG. 8B is a sectional view taken along line X-X' of FIG. 8A, and FIG. 8C is a sectional view taken along line Y-Y' of FIG. 8A;

FIG. 9A is a plan view of the semiconductor device according to an embodiment of the present invention, FIG. 9B is a sectional view taken along line X-X' of FIG. 9A, and FIG. 9C is a sectional view taken along line Y-Y' of FIG. 9A;

FIG. 10A is a plan view of the semiconductor device according to an embodiment of the present invention, FIG. 10B is a sectional view taken along line X-X' of FIG. 10A, and FIG. 10C is a sectional view taken along line Y-Y' of FIG. 10A;

FIG. 11A is a plan view of the semiconductor device according to an embodiment of the present invention, FIG. 11B is a sectional view taken along line X-X' of FIG. 11A, and FIG. 11C is a sectional view taken along line Y-Y' of FIG. 11A;

FIG. 12A is a plan view of the semiconductor device according to an embodiment of the present invention, FIG. 12B is a sectional view taken along line X-X' of FIG. 12A, and FIG. 12C is a sectional view taken along line Y-Y' of FIG. 12A;

FIG. 13A is a plan view of the semiconductor device according to an embodiment of the present invention, FIG. 13B is a sectional view taken along line X-X' of FIG. 13A, and FIG. 13C is a sectional view taken along line Y-Y' of FIG. 13A;

FIG. 14A is a plan view of the semiconductor device according to an embodiment of the present invention, FIG. 14B is a sectional view taken along line X-X' of FIG. 14A, and FIG. 14C is a sectional view taken along line Y-Y' of FIG. 14A;

FIG. 15A is a plan view of the semiconductor device according to an embodiment of the present invention, FIG. 15B is a sectional view taken along line X-X' of FIG. 15A, and FIG. 15C is a sectional view taken along line Y-Y' of FIG. 15A;

FIG. 16A is a plan view of the semiconductor device according to an embodiment of the present invention, FIG. 16B is a sectional view taken along line X-X' of FIG. 16A, and FIG. 16C is a sectional view taken along line Y-Y' of FIG. 16A;

FIG. 17A is a plan view of the semiconductor device according to an embodiment of the present invention, FIG. 17B is a sectional view taken along line X-X' of FIG. 17A, and FIG. 17C is a sectional view taken along line Y-Y' of FIG. 17A;

FIG. 18A is a plan view of the semiconductor device according to an embodiment of the present invention, FIG. 18B is a sectional view taken along line X-X' of FIG. 18A, and FIG. 18C is a sectional view taken along line Y-Y' of FIG. 18A;

FIG. 19A is a plan view of the semiconductor device according to an embodiment of the present invention, FIG. 19B is a sectional view taken along line X-X' of FIG. 19A, and FIG. 19C is a sectional view taken along line Y-Y' of FIG. 19A;

FIG. 20A is a plan view of the semiconductor device according to an embodiment of the present invention, FIG. 20B is a sectional view taken along line X-X' of FIG. 20A, and FIG. 20C is a sectional view taken along line Y-Y' of FIG. 20A;

FIG. 21A is a plan view of the semiconductor device according to an embodiment of the present invention, FIG. 21B is a sectional view taken along line X-X' of FIG. 21A, and FIG. 21C is a sectional view taken along line Y-Y' of FIG. 21A;

FIG. 22A is a plan view of the semiconductor device according to an embodiment of the present invention, FIG. 22B is a sectional view taken along line X-X' of FIG. 22A, and FIG. 22C is a sectional view taken along line Y-Y' of FIG. 22A;

FIG. 23A is a plan view of the semiconductor device according to an embodiment of the present invention, FIG. 23B is a sectional view taken along line X-X' of FIG. 23A, and FIG. 23C is a sectional view taken along line Y-Y' of FIG. 23A;

FIG. 24A is a plan view of the semiconductor device according to an embodiment of the present invention, FIG. 24B is a sectional view taken along line X-X' of FIG. 24A, and FIG. 24C is a sectional view taken along line Y-Y' of FIG. 24A;

FIG. 25A is a plan view of the semiconductor device according to an embodiment of the present invention, FIG. 25B is a sectional view taken along line X-X' of FIG. 25A, and FIG. 25C is a sectional view taken along line Y-Y' of FIG. 25A;

FIG. 26A is a plan view of the semiconductor device according to an embodiment of the present invention, FIG. 26B is a sectional view taken along line X-X' of FIG. 26A, and FIG. 26C is a sectional view taken along line Y-Y' of FIG. 26A; and FIG. 27A is a plan view of the semiconductor device according to an embodiment of the present invention, FIG. 27B is a sectional view taken along line X-X' of FIG. 27A, and FIG. 27C is a sectional view taken along line Y-Y' of FIG. 27A.

DETAILED DESCRIPTION OF THE INVENTION

Figure 3A:
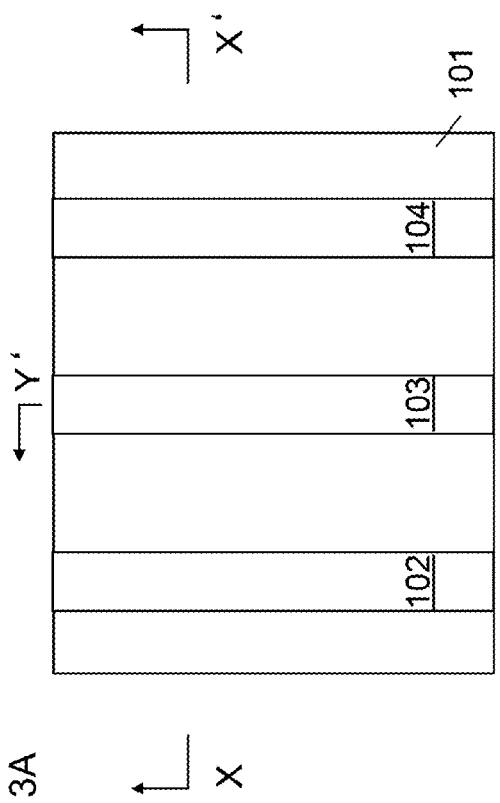
FIG. 3A is a plan view of the semiconductor device according to an embodiment of the present invention.

A semiconductor device according to an embodiment of the present invention will now be described with reference to the attached drawings. It should be understood that the scope of the present invention is not limited to the embodiment described below.

As shown in FIG. 1, the semiconductor device according to this embodiment includes a quadrangular pillar-shaped semiconductor layer 201 that extends in a vertical direction (Z-axis direction), the pillar-shaped semiconductor layer 201 including a first diffusion layer 203, a channel region 210, and a second diffusion layer 202 formed in that order from the substrate side. Floating gates 206 and 207 are respectively disposed in two symmetrical directions (along two parallel straight lines that extend along a Z axis and are provided using the pillar-shaped semiconductor layer 201 as the center) so as to sandwich the pillar-shaped semiconductor layer 201. A control gate line 209 is disposed in two other symmetrical directions (along two parallel straight lines that extend along a Y axis and are provided using the pillar-shaped semiconductor layer 201 as the center) so as to sandwich the pillar-shaped semiconductor layer 201. Tunnel insulating films 204 and 205 are disposed between the pillar-shaped semiconductor layer 201 and the floating gates 206 and 207, respectively. The control gate line 209 that extends along the Y axis is disposed on the outer peripheries of the floating gates 206 and 207 and pillar-shaped semiconductor layer 201 while an inter-polysilicon insulating film 208 is interposed therebetween.

In the semiconductor device of this embodiment, the floating gates 206 and 207 are respectively disposed in two symmetrical directions (along two parallel straight lines that extend along a Z axis and are provided using the pillar-shaped semiconductor layer 201 as the center) so as to sandwich the pillar-shaped semiconductor layer 201 and the control gate line 209 is disposed in two other symmetrical directions (along two parallel straight lines that extend along a Y axis and are provided using the pillar-shaped semiconductor layer 201 as the center) so as to sandwich the pillar-shaped semiconductor layer 201. Therefore, the semiconductor device according to this embodiment is constituted by the pillar-shaped semiconductor layer 201 and the control gate line 209 in a cross section (XZ plane) perpendicular to the Y-axis direction in which the control gate line 209 extends. In such a structure, the floating gates 206 and 207 and the tunnel insulating films 204 and 205 are not present in the X-axis direction. Therefore, the distance between control gate lines 209 adjacent to each other in the X-axis direction can be increased, and the capacitance between the control gate lines 209 can be decreased. As a result, a memory cell array with a high degree of integration is realized.

In the semiconductor device of this embodiment, the widths of the floating gates 206 and 207 in the X-axis direction that is perpendicular to the Y-axis direction in which the control gate line 209 extends are equal to the width of the pillar-shaped semiconductor layer 201 in the X-axis direction that is perpendicular to the Y-axis direction in which the control gate line 209 extends. Therefore, the pillar-shaped semiconductor layer 201 and the floating gates 206 and 207 can be formed in a single process.

The widths of the floating gates 206 and 207 in the X-axis direction that is perpendicular to the Y-axis direction in which the control gate line 209 extends are equal to the width of the pillar-shaped semiconductor layer 201 in the X-axis direction that is perpendicular to the Y-axis direction in which the control gate line 209 extends. Therefore, three side walls of each of the floating gates 206 and 207 are surrounded by the control gate line 209. Thus, high capacitance can be provided between the floating gates 206 and 207 and the control gate line 209.

FIG. 2 shows the semiconductor device according to an embodiment of the present invention. In the semiconductor device, the memory cells shown in FIG. 1 are arranged in a matrix (grid matrix).

As shown in FIG. 2, fin-shaped silicon layers 105, 106, and 107 around which a first insulating film 108 is formed are formed on a silicon substrate 101. The first insulating film 108 is interposed between control gate lines 147 and 148 and the substrate 101, whereby the capacitance between the control gate lines 147 and 148 and the substrate 101 is decreased. First diffusion layers 156, 157, and 158 serving as source lines are formed in upper portions of the fin-shaped silicon layers 105, 106, and 107 so as to extend along the X axis (refer to FIG. 1, the same applies to FIGS. 3 to 27 below). Pillar-shaped silicon layers 121, 122, 123, 124, 125, and 126 are formed on the fin-shaped silicon layers 105, 106, and 107 so as to extend along the Z axis (refer to FIG. 1, the same applies to FIGS. 3 to 27 below). The control gate lines 147 and 148 are formed so as to extend along the Y axis (refer to FIG. 1, the same applies to FIGS. 3 to 27 below).

Referring to FIG. 2, the pillar-shaped silicon layer 121 that includes the first diffusion layer 156, a channel region 211, and a second diffusion layer 150 formed in that order from the substrate 101 side and floating gates 133 and 134 that are respectively formed in two symmetrical directions (along two parallel straight lines that extend along the Z axis and are provided using the pillar-shaped semiconductor layer 201 as the center) so as to sandwich the pillar-shaped silicon layer 121 are disposed in a memory cell in the first row and first column. A control gate line 147 is disposed in two other symmetrical directions (along two parallel straight lines that extend along the Y axis and are provided using the pillar-shaped semiconductor layer 201 as the center). A tunnel insulating film 127 is disposed between the pillar-shaped silicon layer 121 and each of the floating gates 133 and 134. The control gate line 147 that extends along the Y axis is disposed on the outer peripheries of the floating gates 133 and 134 and pillar-shaped silicon layer 121 while an inter-polysilicon insulating film 145 is interposed therebetween.

Referring to FIG. 2, the pillar-shaped silicon layer 122 that includes the first diffusion layer 157, a channel region 212, and a second diffusion layer 151 formed in that order from the substrate 101 side and floating gates 135 and 136 that are respectively formed in two symmetrical directions (along two parallel straight lines that extend along the Z axis and are provided using the pillar-shaped semiconductor layer 201 as the center) so as to sandwich the pillar-shaped silicon layer 122 are disposed in a memory cell in the first row and second column. The control gate line 147 is disposed in two other symmetrical directions (along two parallel straight lines that extend along the Y axis and are provided using the pillar-shaped semiconductor layer 201 as the center). A tunnel insulating film 128 is disposed between the pillar-shaped silicon layer 122 and each of the floating gates 135 and 136. The control gate line 147 that extends along the Y axis is disposed on the outer peripheries of the floating gates 135 and 136 and pillar-shaped silicon layer 122 while an inter-polysilicon insulating film 145 is interposed therebetween.

Referring to FIG. 2, the pillar-shaped silicon layer 123 that includes the first diffusion layer 158, a channel region 213, and a second diffusion layer 152 formed in that order from the substrate 101 side and floating gates 137 and 138 that are respectively formed in two symmetrical directions (along two parallel straight lines that extend along the Z axis and are provided using the pillar-shaped semiconductor layer 201 as the center) so as to sandwich the pillar-shaped silicon layer 123 are disposed in a memory cell in the first row and third column. The control gate line 147 is disposed in two other symmetrical directions (along two parallel straight lines that extend along the Y axis and are provided using the pillar-shaped semiconductor layer 201 as the center). A tunnel insulating film 129 is disposed between the pillar-shaped silicon layer 123 and each of the floating gates 137 and 138. The control gate line 147 that extends along the Y axis is disposed on the outer peripheries of the floating gates 137 and 138 and pillar-shaped silicon layer 123 while an inter-polysilicon insulating film 145 is interposed therebetween.

Referring to FIG. 2, the pillar-shaped silicon layer 124 that includes the first diffusion layer 156, a channel region, and a second diffusion layer 153 formed in that order from the substrate 101 side and floating gates 139 and 140 that are respectively formed in two symmetrical directions (along two parallel straight lines that extend along the Z axis and are provided using the pillar-shaped semiconductor layer 201 as the center) so as to sandwich the pillar-shaped silicon layer 124 are disposed in a memory cell in the second row and first column. The control gate line 148 is disposed in two other symmetrical directions (along two parallel straight lines that extend along the Y axis and are provided using the pillar-shaped semiconductor layer 201 as the center). A tunnel insulating film 130 is disposed between the pillar-shaped silicon layer 124 and each of the floating gates 139 and 140. The control gate line 148 that extends along the Y axis is disposed on the outer peripheries of the floating gates 139 and 140 and pillar-shaped silicon layer 124 while an inter-polysilicon insulating film 145 is interposed therebetween.

Referring to FIG. 2, the pillar-shaped silicon layer 125 that includes the first diffusion layer 157, a channel region 215, and a second diffusion layer 154 formed in that order from the silicon substrate 101 side and floating gates 141 and 142 that are respectively formed in two symmetrical directions (along two parallel straight lines that extend along the Z axis and are provided using the pillar-shaped semiconductor layer 201 as the center) so as to sandwich the pillar-shaped silicon layer 125 are disposed in a memory cell in the second row and second column. The control gate line 148 is disposed in two other symmetrical directions (along two parallel straight lines that extend along the Y axis and are provided using the pillar-shaped semiconductor layer 201 as the center). A tunnel insulating film 131 is disposed between the pillar-shaped silicon layer 125 and each of the floating gates 141 and 142. The control gate line 148 that extends along the Y axis is disposed on the outer peripheries of the floating gates 141 and 142 and pillar-shaped silicon layer 125 while an inter-polysilicon insulating film 145 is interposed therebetween.

Referring to FIG. 2, the pillar-shaped silicon layer 126 that includes the first diffusion layer 158, a channel region, and a second diffusion layer 155 formed in that order from the substrate 101 side and floating gates 143 and 144 that are respectively formed in two symmetrical directions (along two parallel straight lines that extend along the Z axis and are provided using the pillar-shaped semiconductor layer 201 as the center) so as to sandwich the pillar-shaped silicon layer 126 are disposed in a memory cell in the second row and third column. The control gate line 148 is disposed in two other symmetrical directions (along two parallel straight lines that extend along the Y axis and are provided using the pillar-shaped semiconductor layer 201 as the center). A tunnel insulating films 132 is disposed between the pillar-shaped silicon layer 126 and each of the floating gates 143 and 144. The control gate line 148 that extends along the Y axis is disposed on the outer peripheries of the floating gates 143 and 144 and pillar-shaped silicon layer 126 while an inter-polysilicon insulating film 145 is interposed therebetween.

The widths of the pillar-shaped silicon layers 121, 122, 123, 124, 125, and 126 in the Y-axis direction in which the control gate lines 147 and 148 extend are equal to the widths of the fin-shaped silicon layers 105, 106, and 107. Since the X-axis direction in which the fin-shaped silicon layers 105, 106, and 107 extend is perpendicular to the Y-axis direction in which the control gate lines 147 and 148 extend, the fin-shaped silicon layers 105, 106, and 107, the pillar-shaped silicon layers 121, 122, 123, 124, 125, and 126, the floating gates 133, 134, 135, 136, 137, 138, 139, 140, 141, 142, 143, and 144, and the control gate lines 147 and 148 can be formed using two linear masks orthogonal to each other. The floating gates 133, 134, 135, 136, 137, 138, 139, 140, 141, 142, 143, and 144 are respectively disposed in two symmetrical directions (along two parallel straight lines that extend along the Z axis and are provided using the pillar-shaped semiconductor layer 201 as the center) so as to sandwich the pillar-shaped silicon layers 121, 122, 123, 124, 125, and 126. Since the control gate lines 147 and 148 are disposed in two symmetrical directions other than the above two directions (along two parallel straight lines that extend along the Y axis and are provided using the pillar-shaped semiconductor layer 201 as the center) so as to sandwich the pillar-shaped silicon layers 121, 122, 123, 124, 125, and 126, the control gate lines 147 and 148 can be formed in a self-aligned manner.

That is, in this embodiment, the floating gates 133, 134, 135, 136, 137, 138, 139, 140, 141, 142, 143, and 144 are disposed between the pillar-shaped silicon layers 121, 122, 123, 124, 125, and 126 in the Y-axis direction in which the control gate lines 147 and 148 extend. Therefore, when a second polysilicon film 146 (conductive film) for forming the control gate lines 147 and 148 is deposited, portions between the floating gates 133, 134, 135, 136, 137, 138, 139, 140, 141, 142, 143, and 144 are filled with the second polysilicon film 146 whereas portions between the pillar-shaped silicon layers 121, 122, 123, 124, 125, and 126 that extend in the X-axis direction that is perpendicular to the Y-axis direction are not filled with the second polysilicon film 146 (refer to FIGS. 13 and 14). Therefore, when the second polysilicon film 146 is etched so as to be made remain as sidewalls that are formed on the side walls of the pillar-shaped silicon layers 121, 122, 123, 124, 125, and 126, each of the control gate lines 147 and 148 continuously extends in the Y-axis direction whereas the control gate lines 147 and 148 are separated from each other in the X-axis direction that is perpendicular to the Y-axis direction (refer to FIGS. 13 and 14).

Thus, according to the semiconductor device of this embodiment, the degree of integration of semiconductor devices can be increased with decreasing the number of production processes.

A production process of the semiconductor device according to an embodiment of the present invention will now be described with reference to FIGS. 3 to 27.

First, a first step in the production process of the semiconductor device according to this embodiment will be described with reference to FIGS. 3 to 7.

Specifically, fin-shaped silicon layers 105, 106, and 107 are formed on a silicon substrate and a first insulating film 108 is formed around the fin-shaped silicon layers 105, 106, and 107.

Figure 3B:
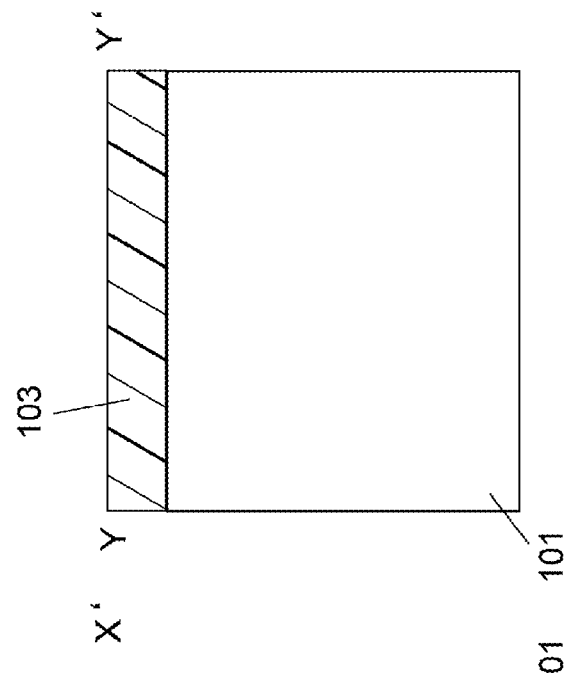
FIG. 3B is a sectional view taken along line X-X' of FIG. 3A.
Figure 3C:
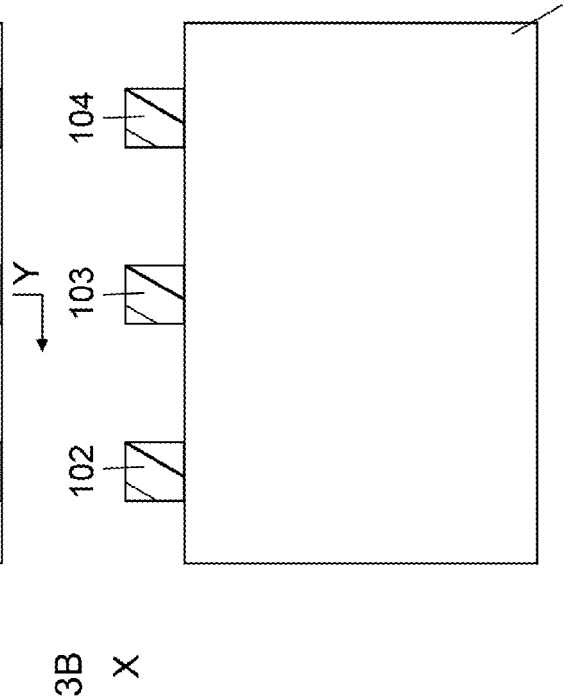
FIG. 3C is a sectional view taken along line Y-Y' of FIG. 3A.

Specifically, as shown in FIG. 3, first resists 102, 103, and 104 for forming fin-shaped silicon layers 105, 106, and 107 are formed on a silicon substrate 101.

As shown in FIG. 4, the silicon substrate 101 is then etched to form fin-shaped silicon layers 105, 106, and 107. Although the fin-shaped silicon layers 105, 106, and 107 have been formed using the resists as masks in this case, a hard mask such as an oxide film or a nitride film may be used.

As shown in FIG. 5, the first resists 102, 103, and 104 are then removed.

As shown in FIG. 6, a first insulating film 108 is then deposited around the fin-shaped silicon layers 105, 106, and 107. An oxide film formed by high-density plasma or an oxide film formed by low-pressure chemical vapor deposition may be used as the first insulating film 108.

As shown in FIG. 7, the first insulating film 108 is then etched back to expose upper portions of the fin-shaped silicon layers 105, 106, and 107.

The first step in the production process of the semiconductor device according to this embodiment has been described with reference to FIGS. 3 to 7, the first step including forming fin-shaped silicon layers 105, 106, and 107 on a silicon substrate 101 and forming a first insulating film 108 around the fin-shaped silicon layers 105, 106, and 107.

Next, a second step in the production process of the semiconductor device according to this embodiment will be described with reference to FIGS. 8 to 12.

In the second step, tunnel insulating films 109, 110, and 111 are formed around the fin-shaped silicon layers 105, 106, and 107 and a first polysilicon film 112 is formed around the tunnel insulating films 109, 110, and 111. The first polysilicon film 112 is then etched so as to be made remain on the side walls of the fin-shaped silicon layers 105, 106, and 107. Second resists 119 and 120 for forming floating gates 133, 134, 135, 136, 137, and 138 and pillar-shaped silicon layers 121, 122, and 123 are then formed so as to extend in the Y-axis direction that is perpendicular to the X-axis direction in which the fin-shaped silicon layers 105, 106, and 107 extend. The fin-shaped silicon layers 105, 106, and 107 and the first polysilicon film 112 are then etched. Thus, the pillar-shaped silicon layers 121, 122, and 123 and the floating gates 133, 134, 135, 136, 137, and 138 are formed.

Specifically, as shown in FIG. 8, tunnel insulating films 109, 110, and 111 are formed around the fin-shaped silicon layers 105, 106, and 107 and a first polysilicon film 112 is formed around the tunnel insulating films 109, 110, and 111.

As shown in FIG. 9, the first polysilicon film 112 is then etched so that part of the first polysilicon film 112 is made remain on the side walls of the fin-shaped silicon layers 105, 106, and 107. Thus, first polysilicon films 113, 114, 115, 116, 117, and 118 having a sidewall shape are formed on the side walls of the fin-shaped silicon layers 105, 106, and 107.

As shown in FIG. 10, second resists 119 and 120 for forming floating gates 133, 134, 135, 136, 137, 138, 139, 140, 141, 142, 143, and 144 and pillar-shaped silicon layers 121, 122, 123, 124, 125, and 126 are then formed so as to extend in the Y-axis direction that is perpendicular to the X-axis direction in which the fin-shaped silicon layers 105, 106, and 107 extend.

As shown in FIG. 11, the fin-shaped silicon layers 105, 106, and 107 and the first polysilicon films 113, 114, 115, 116, 117, and 118 are then etched to form the pillar-shaped silicon layers 121, 122, 123, 124, 125, and 126 and the floating gates 133, 134, 135, 136, 137, 138, 139, 140, 141, 142, 143, and 144. Herein, the tunnel insulating films 109, 110, and 111 are separated from each other by the etching and tunnel insulating films 127, 128, 129, 130, 131, and 132 are formed.

As shown in FIG. 12, the second resists 119 and 120 are then removed.

The second step in the production process of the semiconductor device according to this embodiment has been described. In the second step, as shown in FIGS. 3 to 12, tunnel insulating films 109, 110, and 111 are formed around the fin-shaped silicon layers 105, 106, and 107 and a first polysilicon film 112 is formed around the tunnel insulating films 109, 110, and 111. The first polysilicon film 112 is then etched so as to be made remain on the side walls of the fin-shaped silicon layers 105, 106, and 107. Second resists 119 and 120 for forming floating gates 133, 134, 135, 136, 137, and 138 and pillar-shaped silicon layers 121, 122, and 123 are then formed so as to extend in the Y-axis direction that is perpendicular to the X-axis direction in which the fin-shaped silicon layers 105, 106, and 107 extend. The fin-shaped silicon layers 105, 106, and 107 and first polysilicon films 113, 114, 115, 116, 117, and 118 are then etched. Thus, the pillar-shaped silicon layers 121, 122, and 123 and the floating gates 133, 134, 135, 136, 137, and 138 are formed.

As described above, according to this embodiment, the widths of the floating gates 133, 134, 135, 136, 137, and 138 are equal to the widths of the pillar-shaped silicon layers 121, 122, and 123 (refer to FIG. 12). Therefore, the fin-shaped silicon layers 105, 106, and 107, the pillar-shaped silicon layers 121, 122, and 123, and the floating gates 133, 134, 135, 136, 137, and 138 can be formed by using only linear masks orthogonal to each other.

Next, a third step in the production process of the semiconductor device according to this embodiment will be described with reference to FIGS. 13 and 14. In the third step, an inter-polysilicon insulating film 145 is deposited, and a second polysilicon film 146 formed around the inter-polysilicon insulating film 145 is etched so as to be made remain on the side walls of the floating gates 133, 134, 135, 136, 137, and 138 and the pillar-shaped silicon layers 121, 122, and 123. Thus, control gate lines 147 and 148 are formed.

Specifically, as shown in FIG. 13, an inter-polysilicon insulating film 145 is deposited so as to cover the tunnel insulating films 127, 128, 129, 130, 131, and 132. A second polysilicon film 146 is formed around the inter-polysilicon insulating film 145.

As shown in FIG. 14, the second polysilicon film 146 is etched so as to be made remain on the side walls of the floating gates 133, 134, 135, 136, 137, 138, 139, 140, 141, 142, 143, and 144 and the pillar-shaped silicon layers 121, 122, 123, 124, 125, and 126. Thus, control gate lines 147 and 148 are formed.

As described above, an inter-polysilicon insulating film 145 is deposited, and a second polysilicon film 146 is formed around the inter-polysilicon insulating film 145. The second polysilicon film 146 is then etched so as to be made remain on the side walls of the floating gates 133, 134, 135, 136, 137, 138, 139, 140, 141, 142, 143, and 144 and the pillar-shaped silicon layers 121, 122, 123, 124, 125, and 126. As a result, control gate lines 147 and 148 are formed.

As described above, the fin-shaped silicon layers 105, 106, and 107, the pillar-shaped silicon layers 121, 122, and 123, the floating gates 133, 134, 135, 136, 137, and 138, and the control gate lines 147 and 148 can be formed using two linear masks orthogonal to each other. The floating gates 133, 134, 135, 136, 137, and 138 are respectively disposed in two symmetrical directions (along two parallel straight lines that extend along the Z axis and are provided using the pillar-shaped semiconductor layer 201 as the center) so as to sandwich the pillar-shaped silicon layers 121, 122, and 123. The control gate lines 147 and 148 are disposed in two symmetrical directions other than the above two directions (along two parallel straight lines that extend along the Y axis and are provided using the pillar-shaped semiconductor layer 201 as the center) so as to sandwich the pillar-shaped silicon layers 121, 122, and 123. Therefore, the control gate lines 147 and 148 are formed in a self-aligned manner.

That is, in this embodiment, the floating gates 133, 134, 135, 136, 137, 138, 139, 140, 141, 142, 143, and 144 are disposed between the pillar-shaped silicon layers 121, 122, 123, 124, 125, and 126 in the Y-axis direction in which the control gate lines 147 and 148 extend. Therefore, when the second polysilicon film 146 (conductive film) for forming the control gate lines 147 and 148 is deposited, portions between the floating gates 133, 134, 135, 136, 137, 138, 139, 140, 141, 142, 143, and 144 are filled with the second polysilicon film 146 whereas portions between the pillar-shaped silicon layers 121, 122, 123, 124, 125, and 126 that extend in the X-axis direction that is perpendicular to the Y-axis direction are not filled with the second polysilicon film 146 (refer to FIGS. 13 and 14). Therefore, when the second polysilicon film 146 is etched so as to be made remain as sidewalls that are formed on the side walls of the pillar-shaped silicon layers 121, 122, 123, 124, 125, and 126, each of the control gate lines 147 and 148 continuously extends in the Y-axis direction whereas the control gate lines 147 and 148 are separated from each other in the X-axis direction that is perpendicular to the Y-axis direction (refer to FIGS. 13 and 14).

Thus, according to the method for producing the semiconductor device of this embodiment, the degree of integration of semiconductor devices can be increased with decreasing the number of production processes.

Next, a fourth step in the production process of the semiconductor device according to this embodiment will be described, the fourth step including forming a third resist 149, etching back the third resist 149 to expose upper portions of the control gate lines 147 and 148, and removing the exposed upper portions of the control gate lines 147 and 148 by etching.

Specifically, as shown in FIG. 15, a third resist 149 is formed, and the third resist 149 is etched back to expose upper portions of the control gate lines 147 and 148.

As shown in FIG. 16, the exposed upper portions of the control gate lines 147 and 148 are then removed by etching. Herein, isotropic etching is preferably employed.

As shown in FIG. 17, the third resist 149 is then removed.

The fourth step in the production process of the semiconductor device according to this embodiment has been described, the fourth step including forming a third resist 149, etching back the third resist 149 to expose upper portions of the control gate lines 147 and 148, and removing the exposed upper portions of the control gate lines 147 and 148 by etching.

In the above embodiment, a resist is used to remove the upper portions of the control gate lines 147 and 148, but an oxide film or another material may be used.

As shown in FIG. 18, an impurity such as arsenic or phosphorus is implanted into the pillar-shaped silicon layers 121, 122, and 123 and a heat treatment is performed. Thus, first diffusion layers 156, 157, and 158 and second diffusion layers 150, 151, 152, 153, 154, and 155 are formed.

As shown in FIG. 19, an interlayer insulating film 159 is then formed so as to cover the entirety.

As shown in FIG. 20, a fourth resist 160 for forming contact holes is then formed.

As shown in FIG. 21, the interlayer insulating film 159 is then etched to form contact holes 161, 162, 163, 164, 165, and 166.

As shown in FIG. 22, the fourth resist 160 is then removed.

As shown in FIG. 23, a metal material is then deposited in portions in which contacts are to be formed, to form contacts 167, 168, 169, 170, 171, and 172.

As shown in FIG. 24, a metal 173 is then deposited so as to cover the entirety.

As shown in FIG. 25, fifth resists 174, 175, and 176 for forming bit lines are then formed.

As shown in FIG. 26, the metal 173 is then etched to form bit lines 177, 178, and 179.

As shown in FIG. 27, the fifth resists 174, 175, and 176 are then removed.

Through the steps above, the entire production process for producing the semiconductor device according to this embodiment has been described.

According to the above embodiment, there can be provided a semiconductor device which uses the pillar-shaped silicon layers 121, 122, 123, 124, 125, and 126 (pillar-shaped semiconductor layer 201) and has a structure with a high degree of integration and in which the capacitance between the control gate lines 147 and 148 is decreased.

According to the semiconductor device of the above embodiment, the floating gates 133, 134, 135, 136, 137, 138, 139, 140, 141, 142, 143, and 144 (floating gates 206 and 207) are respectively disposed in two symmetrical directions (along two parallel straight lines that extend along the Z axis and are provided using the pillar-shaped semiconductor layer 201 as the center) so as to sandwich the pillar-shaped silicon layers 121, 122, 123, 124, 125, and 126 (pillar-shaped semiconductor layer 201). The control gate lines 147 and 148 (control gate line 209) are disposed in two symmetrical directions other than the above two directions (along two parallel straight lines that extend along the Y axis and are provided using the pillar-shaped semiconductor layer 201 as the center). Therefore, the cross section (XZ plane) perpendicular to the Y-axis direction in which the control gate lines 147 and 148 extend is constituted by the pillar-shaped silicon layers 121, 122, 123, 124, 125, and 126 (pillar-shaped semiconductor layer 201) and the control gate lines 147 and 148 (control gate line 209). Thus, the distance between the control gate lines 147 and 148 (control gate line 209) is increased, which decreases the capacitance between the control gate lines 147 and 148 (control gate line 209). Furthermore, a memory cell array with a high degree of integration is realized.

According to the semiconductor device of the above embodiment, the widths of the floating gates 133, 134, 135, 136, 137, 138, 139, 140, 141, 142, 143, and 144 (floating gates 206 and 207) in the direction that is perpendicular to the direction in which the control gate lines 147 and 148 (control gate line 209) extend are equal to the widths of the pillar-shaped silicon layers 121, 122, 123, 124, 125, and 126 (pillar-shaped semiconductor layer 201) in the same direction as above. Therefore, the pillar-shaped silicon layers and the floating gates can be formed in a single process.

In the semiconductor device of the above embodiment, the widths of the floating gates 133, 134, 135, 136, 137, 138, 139, 140, 141, 142, 143, and 144 (floating gates 206 and 207) in the direction that is perpendicular to the direction in which the control gate lines 147 and 148 (control gate line 209) extend are equal to the widths of the pillar-shaped silicon layers 121, 122, 123, 124, 125, and 126 (pillar-shaped semiconductor layer 201) in the same direction as above and three side walls of each of the floating gates 133, 134, 135, 136, 137, 138, 139, 140, 141, 142, 143, and 144 (floating gates 206 and 207) are surrounded by the control gate lines 147 and 148 (control gate line 209). Therefore, according to the above embodiment, high capacitance can be provided between the floating gates and the control gate lines.

The semiconductor device of the above embodiment includes the fin-shaped silicon layers 105, 106, and 107 having upper portions in which the first diffusion layers 156, 157, and 158 are formed. Furthermore, the widths of the pillar-shaped silicon layers 121, 122, 123, 124, 125, and 126 in the direction in which the control gate lines 147 and 148 extend are equal to the widths of the fin-shaped silicon layers 105, 106, and 107 and the direction in which the fin-shaped silicon layers 105, 106, and 107 is perpendicular to the direction in which the control gate lines 147 and 148 extend. Therefore, according to the above embodiment, the fin-shaped silicon layers 105, 106, and 107, the pillar-shaped silicon layers 121, 122, 123, 124, 125, and 126, the floating gates 133, 134, 135, 136, 137, 138, 139, 140, 141, 142, 143, and 144, and the control gate lines 147 and 148 can be formed using two linear masks orthogonal to each other. Since the floating gates 133, 134, 135, 136, 137, 138, 139, 140, 141, 142, 143, and 144 are respectively disposed in two symmetrical directions so as to sandwich the pillar-shaped silicon layers 121, 122, 123, 124, 125, and 126, the control gate lines 147 and 148 can be formed in a self-aligned manner. Thus, the degree of integration of semiconductor devices can be increased with decreasing the number of production processes.

The method for producing the semiconductor device according to the above embodiment includes a first step of forming fin-shaped silicon layers 105, 106, and 107 on a silicon substrate 101 and forming a first insulating film 108 around the fin-shaped silicon layers 105, 106, and 107; and, after the first step, a second step of forming a tunnel insulating film 127 around the fin-shaped silicon layers 105, 106, and 107, forming a first polysilicon film 112 around the tunnel insulating film 127, etching the first polysilicon film 112 so that the first polysilicon film 112 is made remain on side walls of the fin-shaped silicon layers 105, 106, and 107, forming second resists 119 and 120 for forming floating gates 133, 134, 135, 136, 137, 138, 139, 140, 141, 142, 143, and 144 and the pillar-shaped silicon layers 121, 122, 123, 124, 125, and 126 in a direction perpendicular to the direction in which the fin-shaped silicon layers 105, 106, and 107 extend, and etching the fin-shaped silicon layers 105, 106, and 107 and the first polysilicon film 112 to form the pillar-shaped silicon layers 121, 122, 123, 124, 125, and 126 and the floating gates 133, 134, 135, 136, 137, 138, 139, 140, 141, 142, 143, and 144 that are respectively disposed in two symmetrical directions so as to sandwich the pillar-shaped silicon layers 121, 122, 123, 124, 125, and 126. Therefore, according to the above embodiment, the widths of the floating gates 133, 134, 135, 136, 137, 138, 139, 140, 141, 142, 143, and 144 are equal to the widths of the pillar-shaped silicon layers 121, 122, 123, 124, 125, and 126, whereby the fin-shaped silicon layers (fin-shaped semiconductor layers), pillar-shaped silicon layers (pillar-shaped semiconductor layers), and the floating gates can be formed using two linear masks orthogonal to each other.

The method for producing the semiconductor device according to the above embodiment further includes, after the second step, a third step of depositing an inter-polysilicon insulating film 145, forming a second polysilicon film 146 around the inter-polysilicon insulating film 145, etching the second polysilicon film 146 so that the second polysilicon film 146 is made remain on the side walls of the floating gates 133, 134, 135, 136, 137, and 138 and the pillar-shaped silicon layers 121, 122, and 123, to form control gate lines 147 and 148. Therefore, according to the above embodiment, the fin-shaped silicon layers, the pillar-shaped silicon layers, the floating gates, and the control gate lines can be formed using two linear masks orthogonal to each other. Since the floating gates are respectively disposed in two symmetrical directions so as to sandwich the pillar-shaped silicon layers, the control gate lines are formed in a self-aligned manner. Thus, the degree of integration of semiconductor devices can be increased with decreasing the number of production processes.

In the above embodiment, various embodiments and modifications can be made without departing from the broad sprit and scope of the present invention. Furthermore, the above-described embodiment is provided to describe one embodiment of the present invention, and the scope of the present invention is not limited thereto.

In the above embodiment, a modification in which the p-type (including the $p^+$-type) and the n-type (including the $n^+$-type) are each changed to the opposite conductivity type is also obviously included in the technical scope of the present invention.

The invention claimed is:

1. A semiconductor device, comprising:
   a pillar-shaped semiconductor layer;
   two floating gates arranged so as to sandwich a channel region of said semiconductor layer; and
   a control gate line disposed so as to surround said two floating gates and said channel region; and
   wherein said two floating gates are arranged in a direction in which said control gate line extends so as to sandwich said said channel region.

2. The semiconductor device according to claim 1, wherein the widths of the floating gates in a direction perpendicular to the directions in which the control gate line extends are equal to the width of the pillar-shaped semiconductor layer in the direction perpendicular to the directions in which the control gate line extends.

3. The semiconductor device according to claim 2, further comprising a fin-shaped semiconductor layer below said pillar-shaped semiconductor layer, wherein said fin-shaped semiconductor layer includes an upper portion in which the first diffusion layer is formed, wherein the width of the pillar-shaped semiconductor layer in the directions in which the control gate line extends is equal to the width of the fin-shaped semiconductor layer, and a direction in which the fin-shaped semiconductor layer extends is perpendicular to the directions in which the control gate line extends.

4. The semiconductor device according to claim 2, wherein three side walls of each of the floating gates are surrounded by the control gate line.

5. The semiconductor device according to claim 4, further comprising a fin-shaped semiconductor layer including an upper portion in which the first diffusion layer is formed, wherein the width of the pillar-shaped semiconductor layer in the directions in which the control gate line extends is equal to the width of the fin-shaped semiconductor layer, and a direction in which the fin-shaped semiconductor layer extends is perpendicular to the directions in which the control gate line extends.

* * * * *